United States Patent [19]
Gabor

[11] Patent Number: 5,969,962
[45] Date of Patent: Oct. 19, 1999

[54] LOW LINE HARMONIC AC TO DC POWER SUPPLY

[76] Inventor: George Gabor, 820 Skywood Rd., Lafayette, Calif. 94549

[21] Appl. No.: 08/871,052

[22] Filed: Jun. 9, 1997

Related U.S. Application Data

[63] Continuation-in-part of application No. 08/325,231, filed as application No. PCT/US94/01796, Feb. 23, 1994, Pat. No. 5,638,265, and a continuation of application No. 08/021,780, Feb. 23, 1993, abandoned.

[51] Int. Cl.[6] .................................................. H02M 5/42
[52] U.S. Cl. ............................................. 363/89; 363/81
[58] Field of Search ................................... 363/78, 79, 81, 363/89, 101; 323/285, 222

[56] References Cited

U.S. PATENT DOCUMENTS

| | | | |
|---|---|---|---|
| 4,974,141 | 11/1990 | Severinsky et al. | 363/81 |
| 5,006,975 | 4/1991 | Neufeld | 383/80 |
| 5,638,265 | 6/1997 | Gabor | 363/89 |

*Primary Examiner*—Adolf Deneke Berhane
*Attorney, Agent, or Firm*—Armstrong Teasdale LLP

[57] ABSTRACT

Methods and apparatus are disclosed for suppressing or eliminating nonlinear current drawing characteristics, while at the same time substantially eliminating high order current harmonics. In accordance with various aspects of the present invention, an energy transfer system, for example a pulse width modulator (PWM) flyback converter (22), comprises an inductor (L) interposed between the AC line voltage and the load ($R_{load}$), with a controllable switch (26) provided between the inductor (L) and the negative supply leg of a rectifier circuit (10). The duty cycle of the converter switch (26) is suitably controlled to produce a substantially constant DC output from the converter (22). Proper synchronization of the converter switch (26) ensures that the current through the inductor (L) and the output current through the load ($R_{load}$) remains in phase with the AC supply voltage. Thus, a power factor on the order of unity is maintained while substantially eliminating nonlinear current drawing characteristics.

41 Claims, 13 Drawing Sheets

LOW LINE HARMONIC AC TO DC POWER SUPPLY

The present application is a continuation-in-part application of U.S. patent application Ser. No. 08/325,231, filed Oct. 21, 1994 now U.S. Pat. No. 5.638,265, which is a 371 application of PCT Application No. PCT/US94/01796, filed Feb. 23, 1994 and a continuation application of U.S. patent application Ser. No. 08/021,780, filed Feb. 23, 1993 now abandoned.

FIELD OF THE INVENTION

The present invention relates, generally, to methods and apparatus for implementing a power supply having a power factor substantially equal to one while substantially eliminating line harmonics, and more particularly to a technique involving the generation of an ideal synthesized current reference waveform which is independent of the AC line voltage waveform and which is employed in the control loop for controlling the duty cycle of the switch mode DC power supply as used in AC-DC, AC-AC, and DC-DC converter applications.

BACKGROUND OF THE INVENTION

For an ideal utility power delivery system characterized by an AC line voltage $V_{in}$, a line impedance $Z_{in}$, and an AC current $I_{in}$, the power delivered to a load is the dot product of the voltage across the load and the current running through the load, or $P_{out}=V_{out}*I_{out} \cos(q)$ where q represents the phase difference between the voltage across the load and the current running through the load. Maximum power is thus most efficiently delivered to the load when the phase angle of the current coincides with the phase angle of the voltage at the load ($\cos(q)=1$), corresponding to a power factor of one.

Power distribution systems typically supply power for loads which are both purely resistive as well as loads which exhibit impedances having substantial reactive components, for example electric motors, power supplies (converters), fluorescent and HID lighting, and the like. The reactive component of load impedance, whether capacitive or inductive, shifts the phase angle of the current running through the load with respect to the supply voltage, resulting in a proportional decrease in power factor at the load and corresponding reduction in the efficiency of the power distribution system. Stated another way, for power factors less than one, an electric utility power company must provide more "power" than is actually consumed by the various loads connected to the power distribution system.

Power factor correction techniques are generally well known. Typically, electronic devices having a reactive component equal in magnitude but opposite in sign to the reactive component of the impedance exhibited by the load are placed in parallel with the load; for example, the common technique is to place a bank of capacitors in parallel across an inductive motor to cancel the inductive reactance produced by the motor. In this way, the power factor is corrected to unity, and the overall impedance of the load appears purely resistive from the perspective of the source (e.g. the power company).

Reactive loads which draw current in a nonlinear fashion are considerably more problematic, however, particularly to the extent that the line current harmonics resulting from the nonlinearities are reflected back to the power source.

Presently known power converters, for example AC-DC converters, and in particular those employing silicon rectifiers, tend to exhibit discontinuous supply line current drawing characteristics, i.e., nonlinear load characteristics. In such systems, current flowing through the load is typically zero until the AC supply voltage exceeds a first DC conduction threshold voltage defined by, inter alia, the rectifier circuit. Thereafter, the current through the load increases sharply, limited primarily by line impedance. The current level again returns to zero as the AC supply voltage drops below a second DC conduction threshold voltage, typically defined by the filter capacitor and the rectifier circuit. Consequently, the diode conduction angle is restricted to a relatively small angular region centered around $\pi/2$ radians in the AC line voltage, which constitutes a comparatively small fraction of the total potential conduction angle provided by a rectified sine wave. As a result of this reduced conduction angle, substantially all of the power consumed by the load is drawn during a small portion of the AC cycle, resulting in very high current peaks and, hence, very high peak-to-RMS current ratios (crest factors). In addition, these nonlinear current drawing characteristics produce high frequency harmonics which are reflected back to transformer cores in the distribution system.

These high crest factors and harmonic components negatively affect the utility company's ability to adequately provide power to an increasingly complex universe of consumers. For example, it is known that transformer core losses are a function of the square of the frequency of reflected current harmonics. Moreover, high crest values require that the total generating capacity and the transformers used by utilities to produce electrical power be of sufficient size to supply the needed crest current. The capital cost to the utility companies to provide the extra generating capacity and large transformers is extraordinary.

Moreover, as more nonlinear electronic equipment (e.g., computers) is connected to existing power distribution systems, high frequency noise generated by nonlinear loads tends to interact with other electronic equipment on the same power distribution line, which may result in a degradation in the reliability of these devices, for example manifesting as a loss of data system integrity for computer systems.

Passive methods to reduce the nonlinear current drawing effects of power consumption devices typically involve the use of an inductive-type filters used in conjunction with the load. These filters, however, are quite large and expensive.

Active methods to reduce nonlinear current consumption have also been constructed, but they too are unsatisfactory in several regards. For example, many active correction schemes employ a feedback loop using a non-filtered voltage wave shape to correct the current waveform which is detected at the AC input. While these active systems generally yield good power factor characteristics, they tend to amplify the deleterious effects of harmonic distortions present on the voltage waveform of the AC input line.

An apparatus for suppressing or eliminating nonlinear current drawing characteristics of a load is thus needed which overcomes the shortcomings of the prior art.

SUMMARY OF THE INVENTION

The present invention provides methods and apparatus for suppressing or eliminating nonlinear current drawing characteristics, while at the same time substantially eliminating high order current harmonics, independent of the AC voltage waveform.

In accordance with one aspect of the present invention, an energy transfer system, for example a pulse width modulator (PWM) flyback converter (configured as a boost converter), is employed to substantially eliminate nonlinear current drawing characteristics. The flyback converter comprises an inductor interposed between the AC line voltage and the load, with a controllable switch provided between the inductor and the negative supply leg of a rectifier circuit. The duty cycle of the converter switch is suitably controlled in accordance with one or more parameters to produce a substantially constant DC output from the converter which is applied to the load. At the same time, proper synchronization of the converter switch ensures that the current through the inductor and, hence, the output current through the load, remains in phase with the AC supply voltage. Thus, a power factor on the order of unity is maintained while substantially eliminating nonlinear current drawing characteristics.

In accordance with a further aspect of the invention, the PWM circuit which governs the duty cycle of the converter switch is suitably controlled such that power through the load and, hence, the current drawn from the input line, varies as a function of the square of the AC line signal.

In accordance with a further aspect of the present invention, the current reference signal used in the PWM control loop is independent of the AC line signal. In this way, the PWM control scheme is independent of harmonics which may be present on the AC line.

In accordance with yet a further aspect of the present invention, a synthesized current reference signal is generated using the zero crossings of the AC input waveform, which synthesized waveform corresponds to an ideal half sine wave.

In accordance with a further aspect of the invention, the aforementioned synthesized current reference waveform may be advantageously employed in the context of a three phase power distribution system.

In accordance with the solutions to the governing equations, the basic control algorithm is composed of multiple nested loops to produce a control signal from the system input values, ie. RMS AC line voltage, $V_{out}$, $I_{in}$ and a synthesized sine waveform in phase with the AC line voltage.

BRIEF DESCRIPTION OF THE DRAWINGS

The subject invention will hereinafter be described in conjunction with the appended drawing figures, wherein like designations correspond to like elements, and.

DETAILED DESCRIPTION

It is well known that maximum efficiency in power distribution may be obtained when the impedance of the load appears purely resistive to the source. More particularly and with reference to FIG. 1, the power into a resistive load $R_{load}$ is $P=I^2 R_{load}$, where I is the current flowing in the load. Since $$I_{out} = \frac{V_{out}}{R_{load}} \quad \& \quad V_{in} = V_{peak}\sin(\omega_{line}t)$$

for a resistive load across the AC line, $$I_{out} = \frac{V_{peak}\sin(\omega_{line}t)}{R_{load}} \quad \& \quad P = \frac{V_{peak}^2 \sin(\omega_{line}t)^2}{R_{load}};$$

that is, the instantaneous power to the load varies in phase as the square of the line voltage. This represents the ideal load condition. The system loss is minimal when $Z_{line}$ is only real, i.e. $Z_{line}$ is equal to $R_{line}$, therefore;

$$P_{loss\,min} = \frac{V_{peak}^2 \sin(\omega_{line}t)^2}{R_{line}}.$$

Figure 1:
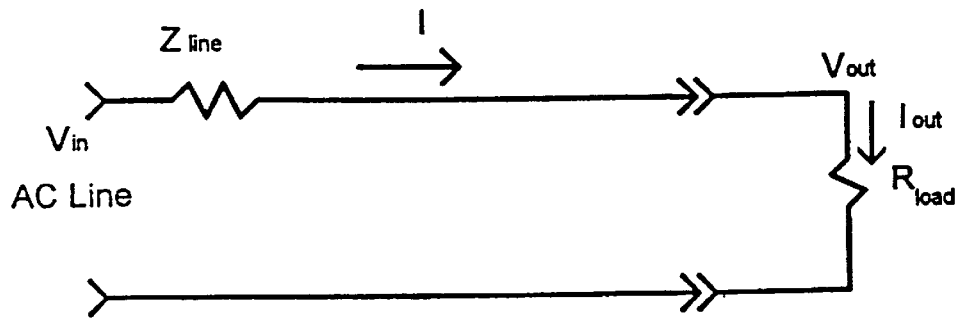
FIG. 1 is a schematic circuit diagram of an ideal load.
Figure 2:
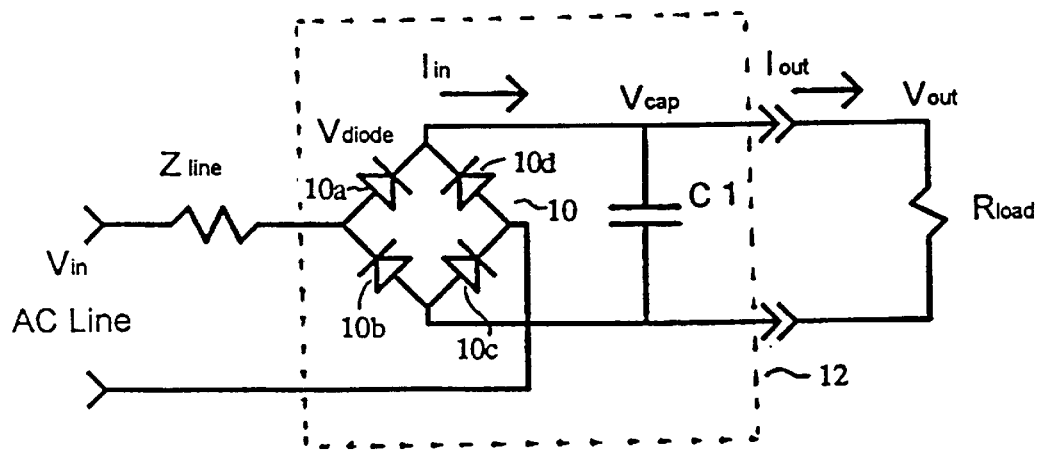
FIG. 2 is a schematic circuit diagram of the ideal load of FIG. 1 having an AC/DC converter incorporated therein.

Referring now to FIG. 2, the addition of a full wave rectifier bridge 10 and a capacitor C1 to the circuit of FIG. 1 gives a simple DC power supply 12.

DC power supply 12 looks capacitively reactive to the input AC power line. Respective diodes 10a–10d comprising bridge rectifier 10 are suitably biased with a voltage offset equal to the output voltage on capacitor $C_2$. This bias results in the nonlinear input current behavior of the supply. Using FIG. 2 as a typical input supply circuit, equations characterizing the system may be developed.

Diode conduction starts when $V_{in}$ meets the following condition:

$$V_{in1} = 2V_{diode} + V_{cap1},$$

where the 1 index indicates the start of conduction. Diode conduction thus stops at $$V_{in2} \cong 2V_{diode} + V_{cap1} + \frac{V_{peak}\int_{t1}^{t2}\sin(\omega_{line}t)dt - (2V_{diode} + V_{cap1})}{CZ_{line}},$$

where the 2 index indicates conduction cut off. Assuming that $\Delta V_{cap}$ is $<<V_{cap}$, $CR_{load}>>CZ_{line}$, and t1, t2 are the start and stop conduction phase angle times, $\Delta V_{cap}$ (i.e., the ripple voltage across the capacitor) can be solved for during the diode cutoff period as a function of a complex power of t as follows:

$$\Delta V_{cap} = V_{cap2}\left[1 - e^{\frac{-\left(\left(t_1 + \frac{\pi}{\omega_{line}}\right) - t2\right)}{CR_{load}}}\right].$$

The current amplitude upon conduction is limited by the low impedance between the line and filter capacitors plus $Z_{line}$. Including the supply impedance in $Z_{line}$ gives $$I_{cond} = \frac{V_{peak}\sin(\omega_{line}t) - (2V_{diode} + V_{cap})}{Z_{line}}$$

The equation is valid between t1 and t2.

This circuit characteristic produces no current flow for the majority of the line voltage sine wave, but produces very high peak currents, since all the power to the load is necessarily delivered during the diode conduction phase angle. The system input efficiency suffers because even though current only flows for a small time, losses increase as a function of the square of the current. Moreover, resistance loss increases proportional to the inverse of the conduction time. This discontinuous current waveform is rich in odd high order harmonics. The energy content of the higher order harmonics also increases by the inverse of the conduction time.

Figure 3:
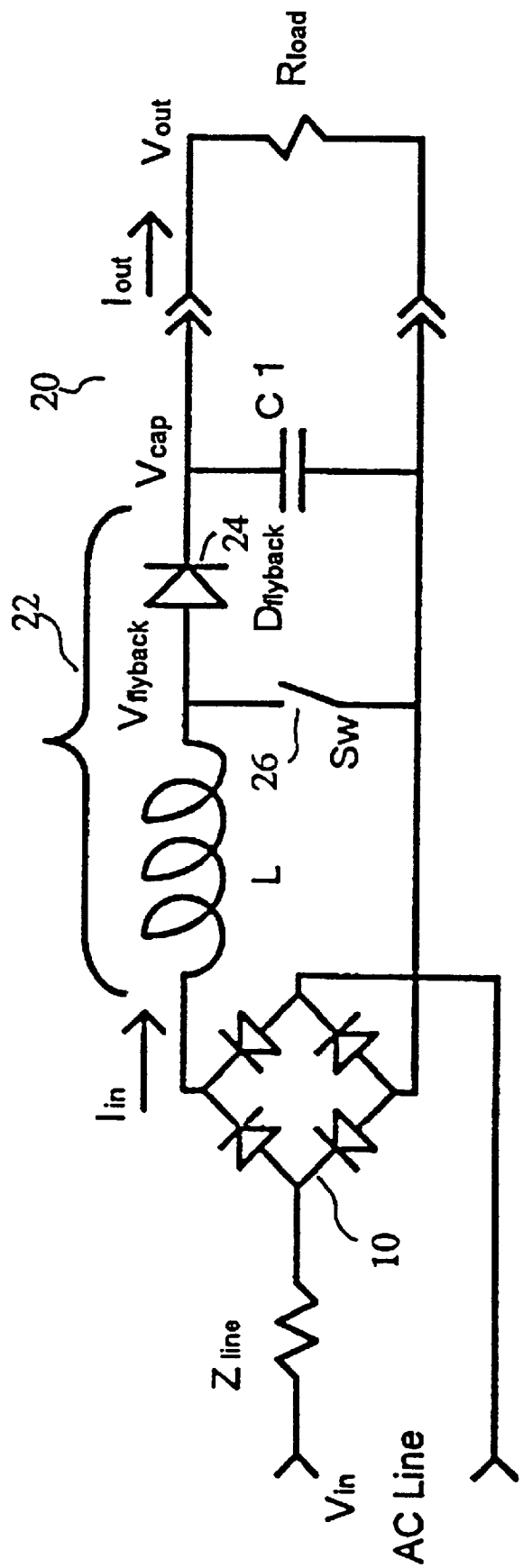
FIG. 3 is a schematic circuit diagram of the circuit of FIG. 2 further including an energy transfer circuit mechanism.

Referring now to FIG. 3, a generalized method for eliminating nonlinear current drawing characteristics is suitably described in conjunction with a power distribution circuit 20. Circuit 20 suitably comprises bridge rectifier 10 supplied by the AC line, with a capacitor C1 disposed in parallel across the load $R_{load}$ as in FIG. 1, but with a flyback converter circuit 22 interposed between rectifier 10 and capacitor C1. Flyback converter 22 suitably comprises an inductor L, a flyback diode 24 and a switch 26. This type of flyback converter arrangement is described in detail in Wilkinson et al., U.S. Pat. No. 4,677,366, issued Jun. 30, 1987 and incorporated herein by this reference. Such flyback converter systems are characterized in that $V_{in}*I_{in}$; i.e., $P_{in}$, is proportional to $V^2_{out}/R_{load}$, and wherein $V_{in}$ need not be equal to $V_{out}$.

When switch 26 is open, the current $I_{in}$ output from rectifier 10 is applied to inductor L1 (also known as a boost inductor), through diode 24, charging capacitor C1. Because of the energy storage capability of inductor L1, capacitor C1 may be charged to a voltage value which exceeds $V_{peak}$. When switch 26 is closed, capacitor C1 discharges, supplying current to $R_{load}$, as discussed in greater detail below.

With continued reference to FIG. 3, the "boost" voltage supplied by inductor L1 plus the input voltage $V_{in}$ essentially comprises the output voltage $V_{out}$ applied to the load. More particularly, inductor L1 generates a boost voltage as a result of switch 26 first shorting the inductor to the negative supply leg of bridge rectifier 10, causing current to flow through the inductor. When switch 26 is opened, as discussed in greater detail below, inductor Li "flies back", causing a voltage $V_{flyback}$ to develop across the inductor in reverse polarity to input voltage $V_{in}$; that is, the flyback voltage developed across inductor L1 has a positive to negative polarity going from right to left in FIG. 3.

The voltage across inductor L1 rises until $$V_{in}+V_{flyback}>V_{Dflyback}+V_{cap}.$$

Capacitor C1 is recharged at the switching frequency of switch 26, with the amount of charge determined by the switching period duty cycle.

With continued reference to FIG. 3, for a given input voltage ($V_{in}$, or $V_e$) and a switching frequency ($F_{switch}$, where $F_{switch}>>F_{line}$), $V_{in}$ can be treated as a constant during a single switching cycle. Therefore, $$V_{in}*I_{in}=V_{out}\$I_{out}$$

at a fixed switch on to off ratio (i.e. duly cycle). When the off period permits complete discharge of the stored energy in the inductor, then $$V_{in}*I_{in}=P_{constant}=V_{out}\$I_{out}$$

when $V_{out}$ is $>V_{in}$. For the boost configuration, the flyback diode does not conduct until $$V_{flyback}=V_{out}+V_{diode}-V_{in}$$

since $$V_{flyback} = L\frac{\Delta I}{\Delta t}$$

and the energy (E) stored each cycle in the inductor is $$E = \frac{LI_2}{2}$$

for I equal to zero at the beginning of each cycle. If E is not zero in the inductor, $V_{flyback}$ will instantaneously rise until current $I_{out}$ flows through the load, which is the case if the flyback diode is not conducting; thus, $V_{flyback}$ increases until the conduction condition described above is met. Since $V_{flyback}$ meets the flyback condition, the PWM duty cycle determines the power extracted from the input line.

With momentary reference to FIG. 1, for a fixed load R, $P_{out}$ is proportional to $V^2_{peak}\sin^2(\omega_{line}t)$, that is, to have a load look resistive to the input line, power is extracted at a $V^2_{peak}\sin^2(\omega_{line}t)$ rate.

The power into inductor L1 during $t_{on}$ can be found as $$V_{in} = L\frac{dI}{dt} = L\frac{\Delta I}{\Delta t}.$$

If $F_{switch}>>F_{line}$, then $V_{in}$ can be considered constant during any switch cycle permitting a $\Delta$ approximation. For a fixed duty cycle and letting $V_{in}=V_{peak}\sin(wt)$ and $\Delta t=t_{on}$, then $$\Delta I = \frac{V_{peak}\sin(\omega_{line}t)t_{on}}{L} \text{ where } t_{on} < \frac{1}{F_{switch}} = t_{on} + t_{off}.$$

Let $I_p$ equal the maximum value of $\Delta I$ for any cycle during $t_{on}$. The energy (i.e. power) input from the AC line each switching cycle is thus $$E = \frac{V_{in}\Delta I t_{off}}{2} \text{ during } t_{off}$$

and $$E = \frac{V_e\Delta I t_{off}}{2} \text{ during } t_{off};$$

rearranging, $I_p=t_{on}V_{peak}\sin(w_{line}t)/L$. (Note: $I_p=I_{max}$ when $w_{line}t=\pi/2$ for a fixed $t_{on}$.)

Then $$P_{in_{on}} = \frac{LI_p^2}{2t_{on}} \text{ and } P_{in_{off}} = \frac{V_{in}\Delta I}{2}.$$

Summing, $$P_{in_{on}} + P_{in_{off}} = \frac{t_{on}V_{peak}^2 \sin^2(\omega_{line}t)}{L}.$$

Therefore, $P_{in}$ is proportional to $V^2_{peak} \sin^2(\omega_{line}t)$, if $t_{on}$, $V_{peak}$ and L are viewed as constants. Power is thus extracted from the line as $V^2_{peak} \sin^2(\omega_{line}t)$, which from the resistive load example above, means the DC supply circuit behaves like an ideal resistive load to the AC input line.

Turning now to the output characteristics of converter 22, recall that it was assumed for purposes of the foregoing discussion that for a given output load all the stored energy in inductor L1 could be dumped to the filter capacitor during $t_{off}$. In accordance with the preferred embodiment discussed herein, it is desirable, in fact, not to let the inductor current go to zero each switching cycle in order to minimize switching frequency current ripple, as discussed in greater detail below.

With continued reference to FIG. 3, the duty cycle of switch 26 substantially controls the energy stored in inductor L1 during each switching cycle; hence, the duty cycle of switch 26 effectively controls the value of voltage $V_{out}$. More particularly, $V_{out}$ may be controlled as a function of the input voltage $V_{in}$ and the duty cycle of switch 26 as follows:

$$V_{in} = L\frac{\Delta I}{t_{on}}$$

$$V_{out} = V_{in} + L\frac{\Delta I}{t_{off}} - V_{Dflyback}$$

Since $\Delta I$'s are equal if I goes to zero each switch cycle, then $$-V_e t_{on} = L\Delta I = (V_{out} - V_e V_{Dflyback})t_{off}$$

Ignoring $V_{Dflyback}$, $$V_{out} = V_{in}\left(1 + \frac{t_{on}}{t_{off}}\right).$$

Thus, by controlling $t_{on}$ as $V_{in}$ varies, e.g. via a voltage control loop, the output voltage $V_{out}$ may be maintained at a substantially constant level.

Figure 4:
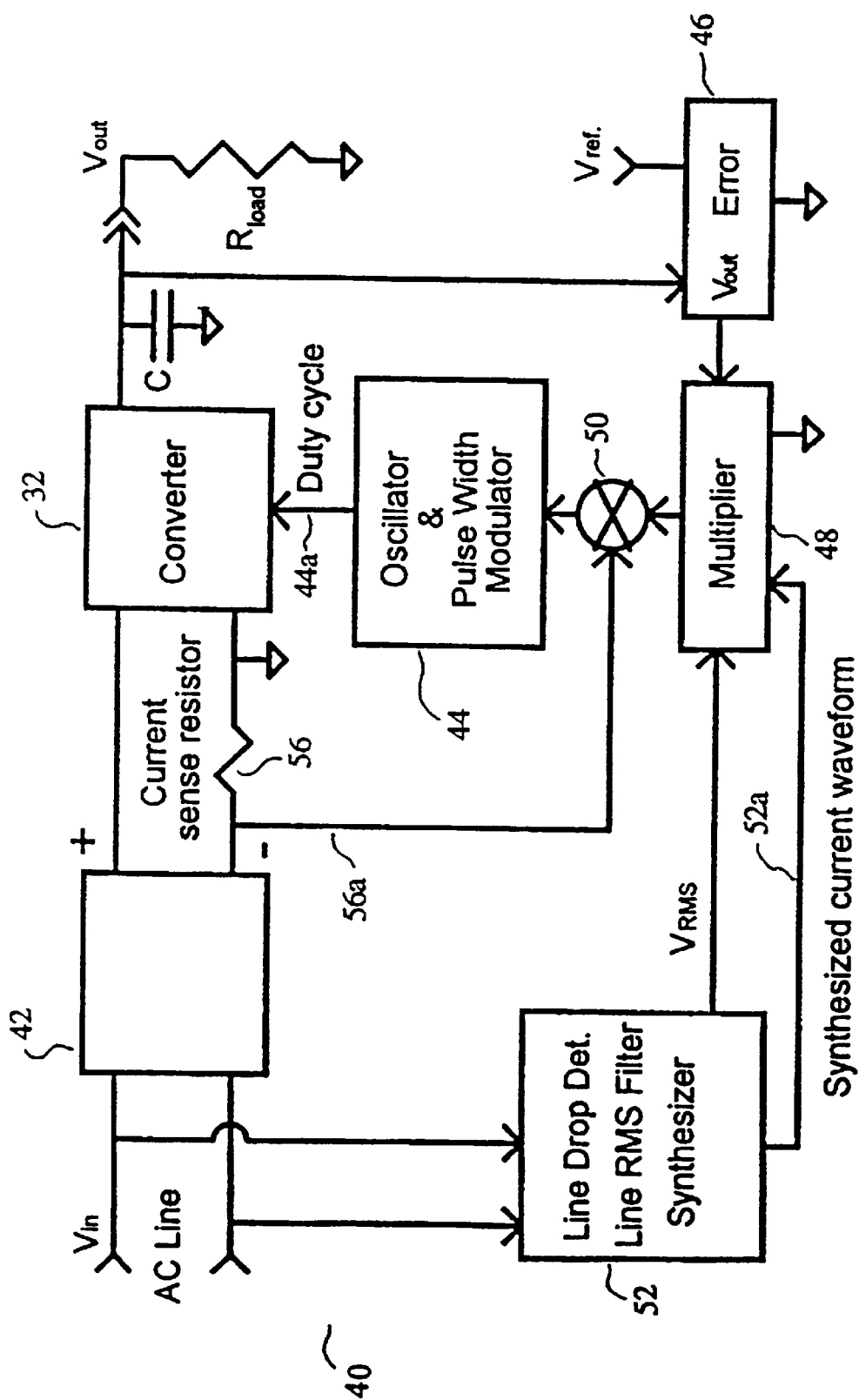
FIG. 4 is a functional block diagram of a power distribution system in accordance with the present invention including a synthesized reference waveform controlled feedback loop.

With momentary reference to FIG. 4, the PWM control scheme of the present invention may suitably be illustrated in conjunction with a power distribution control circuit 30, wherein the duty cycle of an exemplary converter 32 (e.g. flyback converter 22) is suitably controlled by a number of feedback loops embodying various parameters, for example a voltage error signal, an average (e.g. RMS) value of the input voltage signal $V_{in}$ and the like.

In accordance with a further aspect of the present invention, the rectified sine wave, i.e. the half sine wave signal applied to the converter (e.g. converter 22 in FIG. 3) provides that:

$$V_{in} = |V_{peak} \sin(w_{line}t)|, \text{ for } w_{line}t = 0, p, 2p, \ldots, np,$$

where $$n = 0, 1, 2, 3, \ldots \text{, then } \sin(w_{line}t) = 0.$$

Therefore, at $V_{in}=0$, the ratio of $t_{on}/t_{off}$ theoretically goes to infinity. Since switch 26 is suitably switched at a fixed frequency, a current zero crossing distortion will occur as $t_{on}$=>max. value and $t_{off}$=>min. value. To reduce this problem, a second loop is suitably employed to control $t_{on}$ in accordance with the instantaneous $V_{in}$ waveform. This second loop advantageously exhibits a moderate bandwidth and a gain greater than one. However, if the input AC line voltage waveform is distorted, e.g., if $V_{in}$ embodies harmonics or spurious transients, the current waveform drawn by the load will be further distorted because of the gain in the loop band pass. The increased current distortion occurs because the current control loop forces the current input waveform to track the distorted voltage waveform. Further, the voltage waveform is additionally distorted by the distorted input current waveform generating a delta distorted voltage across the input line impedance ($Z_{line}$). To eliminate this problem an ideal synthesized current waveform synchronized to the AC input line is used to correct the current waveform.

Returning now to FIG. 3, output filter capacitor C1 plays an important role in maintaining a resistive looking input impedance. More particularly, capacitor C1 buffers the output voltage rise ($V_{out}$) when excess charge is dumped (by inductor L1) during any switching cycle and does not let $V_{out}$ sag very much while the inductor is being charged. Assuming a fixed output duty cycle with a resistive load, but without the restriction that the inductor current goes to zero each switch cycle, the change in stored energy in the flyback inductor L1 for $t_{on}$ is:

$$\Delta E_{on} = \frac{L(2I_1\Delta I + \Delta I^2)}{2} \text{ and } \Delta I = \frac{V_{in}t_{on}}{L}$$

Substituting $I_2$ $$\Delta E_{on} = \frac{L(2I_1\Delta I + \Delta I^2)}{2} \text{ and } \Delta I = \frac{V_e t_{on}}{L}$$

$$\Delta E_{on} = \frac{3V_{in}^2 t_{on}^2)}{2L}$$

For $t_{off}$, $$\Delta E_{off} = \frac{V_{in}\Delta I t_{off}}{2} = \frac{V_{in}^2 t_{on} t_{off}}{2L}$$

$t_{on}$ and $t_{off}$ maximum when $t_{on} = t_{off} = .5\tau_{sw}$ $$\Delta E_{on} + \Delta E_{off} = \frac{V_{in}^2 t_{on}^2}{L}$$

The above solution suggests that if $t_{off}$ is not long enough to permit the inductor current go to zero, additional energy is stored in the inductor, biasing its magnetic circuit. However, as long as the inductor does not saturate, this should not adversely affect system performance. Moreover, since $t_{on}$, $t_{off}$ and L are constants and dividing E by $t_{on}$ to give power, the load draws input power in proportion to $V^2_{in}$. Thus, the supply input looks like a resistor to the input line, which is the ideal case.

An additional problem addressed by the present invention surrounds the ripple content of $V_{out}$ in the voltage feedback loop, since any switching harmonics will modulate the current. The switching harmonics may be advantageously reduced by using a current bucking bifilar filter choke (FIG. 5) which reduces peak capacitor charging current ripple by integrating it over a switching cycle, but cancels out the DC average current keeping the filter core from saturating. A simple low-pass filter in the output voltage feedback loop with a corner frequency <$F_{switch}/10$, but >$10F_{line}$, will give good transient response to load transients but avoid switching noise problems.

Loop Configuration.

Although many configurations of buck or boost flyback converters, whether or not isolated, as well as any suitable energy transforming system may be advantageously employed in the context of the present invention, an exemplary non-isolated boost configuration is set forth in the illustrated embodiment (FIG. 3). A boost configuration shown in FIG. 4 will continue to be used to demonstrate the loop configuration, as it offers almost continuous current draw from the AC input line, reducing filtering requirements, and has a filter element (i.e. the inductor) between the line and the switcher. The boost voltage is also clamped by the filter capacitor which minimizes the voltage stress on the switching elements. Additionally, one side of the switching element is advantageously at the reference ground which permits a simple current monitoring and feedback method for the current control loop.

Referring again to FIG. 4, circuit 40 suitably comprises a rectifying circuit 42, a converter circuit 32, for example an AC-DC converter, a capacitor C, an oscillator and PWM circuit 44, an error signal circuit 46, a multiplier circuit 48, a differencing amplifier 50, and a synthesizing circuit 52.

Circuit 40 appears as a resistive load to the line for a fixed PWM, a fixed load, and a fixed RMS input voltage. To stabilize the output voltage $V_{out}$, the pulse width signal 44a applied to converter 32 suitably varies in proportion to both changes in the RMS value of the input voltage and the output voltage. The output voltage error signal applied to multiplier circuit 48 by error circuit 46 provides the correction value for $V_{out}$ variations. The line RMS signal applied to multiplier 48 by the line RMS filter circuit 52 compensates the PWM signal for variations in the RMS value of $V_{in}$. In this regard, the RMS loop modulator control signal may be advantageously normalized by $V^2_{RMS}$ since $P_{in}$ varies as $V^2_{in}$. Decreases in either the output error signal or the RMS signal increase the PWM value.

As the output load increases, the PWM signal and, hence, the duty cycle of converter circuit 32 must also increase to maintain the energy transformation; since $V_{out}$ is fixed, $I_{out}$ will vary with varying load. The duty cycle computed by PWM circuit 44 is a function of the output voltage $V_{out}$ and the input voltage $V_{in}$, and may be expressed as the ratio of the on to off switching time of converter 32 as follows:

$$\frac{t_{on}}{t_{off}} = \frac{V_{out}}{V_\epsilon} - 1$$

The above equations show the output-input relationship with duty cycle ratio. It is clear that as $V_{out}$=>$V_{in}$, the system's ability to power transform =>0. Therefore a maximum on time has to be set as $V_{in}$=>$V_{out}$ to maintain the $V_{out}$ to $V_{in}$ ratio under maximum power output. Also, to optimize the inductor utilization, a duty cycle on the order of about 50% may be employed when $I_{out}$ is maximum and $V_{out}$-$V_{in}$ is minimum. However, when $V_{in}$=>0 the $t_{on}$ period (duty cycle) needs to increase, for example to a duty cycle approaching 100%.

$V_{in}$ goes to zero every half cycle of the line frequency. To provide this function, a third loop is introduced. A synthesized waveform function 52a is suitably differenced with a current feedback signal 56a, generated by a current sensor 56, at differencing amplifier 50. The output of amplifier 50 is suitably applied to PWM circuit 44 and used to modulate the switching pulse width. This second loop is suitably a relatively fast loop in comparison to the RMS value correction.

Figure 5:
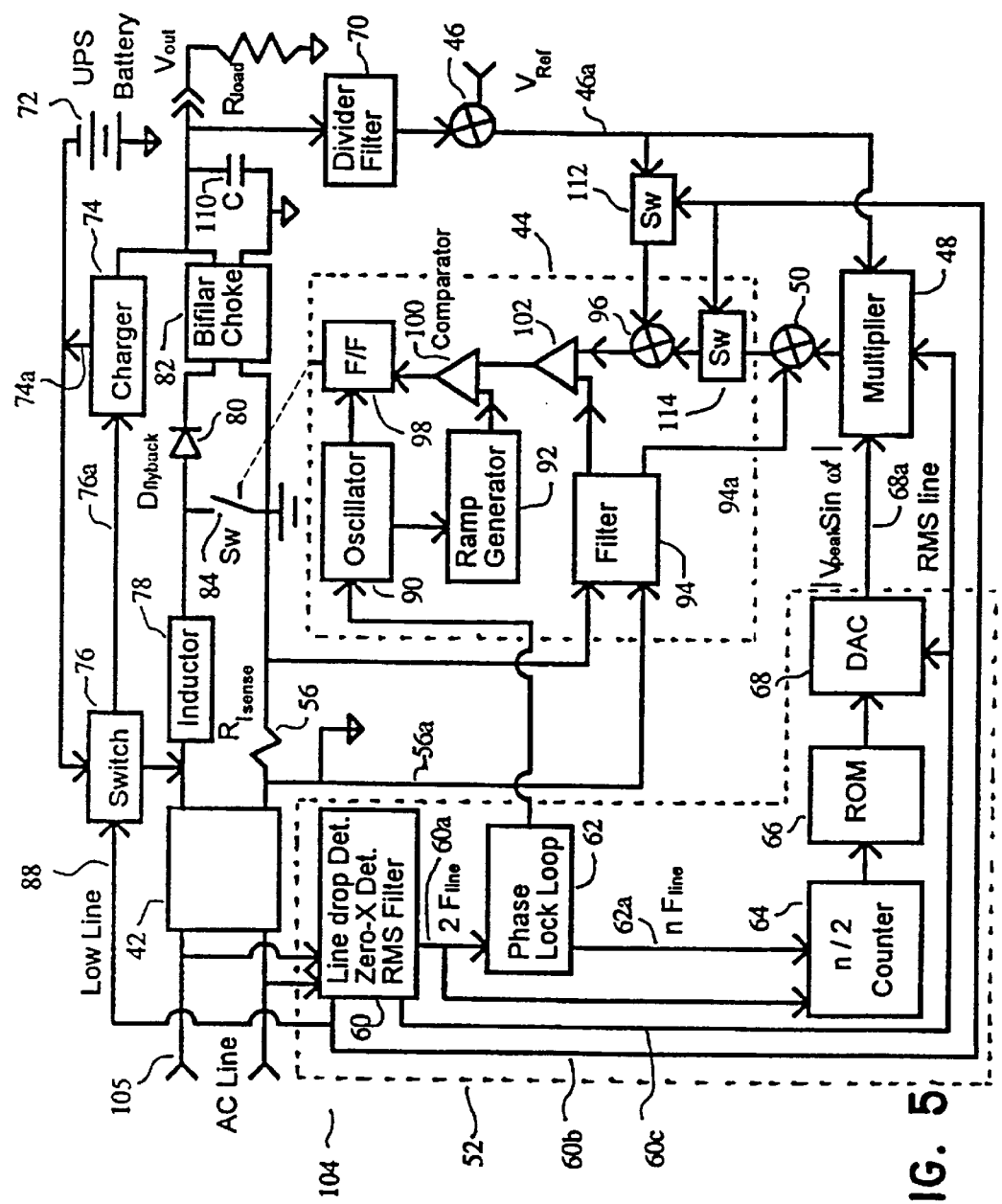
FIG. 5 is a functional block diagram detailing the various functional blocks of FIG. 4.

Referring now to FIG. 5, a suitable supply circuit 104 useful in implementing many features of the present invention suitably comprises a rectifier circuit 42 connected to an AC input line 105, an inductor circuit 78 to which the output of rectifier circuit 42 is suitably applied, a diode 80 and a switch 84 configured to cooperate with inductor circuit 78 in a manner analogous to that described above in conjunction with FIG. 3, a bifilar choke circuit 82, a capacitor 110, an output load $R_{load}$, a battery 72, and an uninterruptible power supply (UPS) comprising a charger 74, and a charger switch 76.

Circuit 104 further comprises synthesizer circuit 52 connected to AC input line 105, a current sensing circuit 56 configured to sense the current through the load, PWM circuit 44, differencing amplifier 50, multiplier 48, a divider filter 70, voltage difference circuit 46, and an error signal switch 112.

Synthesizing circuit 52 suitably comprises a characteristic detector circuit 60, a phase lock loop circuit 62, a counter circuit 64, a ROM 66, and a digital-to-analog converter (DAC) circuit 68. PWM control circuit 44 suitably comprises an oscillator circuit 90, a ramp generator circuit 92, a filter circuit 94, respective switches 96 and 114, a comparator 100, a difference amplifier 102, and a flip-flop 98 configured to control the state of switch 84.

As discussed above in conjunction with FIGS. 3 and 4, inductor 78, diode 80 and capacitor 110 suitably cooperate to maintain an essentially constant output voltage $V_{out}$ across the load. Moreover, by controlling the duty cycle of switch 84 in accordance with a reference signal derived from the AC line input, the current drawn by the load $I_{out}$ remains in phase with the line voltage (resulting in a power factor of substantially unity), while at the same time substantially eliminating line harmonics.

In accordance with one aspect of the present invention, the duty cycle of switch 84 is controlled in accordance with a plurality (e.g. four) separate but interrelated control loops, which constitute the basic control algorithm.

A first feedback loop controls the duty cycle of switch 84 in accordance with output voltage $V_{out}$. More particularly, output signal $V_{out}$ is suitably divided and filtered by divider circuit 70 to an appropriate value, whereupon the voltage divided signal is applied to differencing amplifier 46 which compares it with a predetermined reference signal $V_{ref}$. In accordance with one aspect of the present invention, the value of $V_{ref}$ is suitably selected to be equal to (or proportional to) the desired load voltage ($V_{out}$). Differencing amplifier 46 generates an output error signal 46A indicative of the difference between output signal $V_{out}$ and reference signal $V_{ref}$, and applies this error signal to multiplier circuit 48. The manner in which multiplier circuit 48 manipulates error signal 46A is discussed in greater detail below.

Error signal 46A is also supplied to switch 112. In this regard, characteristic detector circuit 60 suitably comprises circuitry (not shown) which detects when the steady state voltage on input line 105 drops below a predetermined threshold value, indicating a low line condition of sufficient severity to switch battery 72 into the system, for example via switch 76. For purposes of describing the function of error signal 46A, it is sufficient for present purposes to state that a low line voltage signal 60B is generated by characteristic detection circuit 60 when the AC line voltage 105 drops below the threshold value, whereupon switch 112 multiplies error signal 46A by a predetermined value of low line detection output signal 60B and applies the result to differencing amplifier 96. In this way, at low line voltages the supply switches over to the battery, and different references are used for DC control.

With respect to the second control loop, characteristic detection circuit 60 suitably comprises circuitry (not shown) configured to detect and filter the RMS voltage value of AC input line 105, and apply an output signal 60C indicative of the RMS value of input signal 105 to multiplier circuit 48. In this way, the duty cycle of switch 84 is also controlled as a function of and, hence, is capable of compensating for variations in, the steady state RMS value of AC input signal 105.

With respect to the third control loop, characteristic detection circuit 60 further comprises circuitry (not shown) configured to precisely detect the zero crossings of AC input signal 105, and to generate an output signal 60A in accordance with the zero crossings. In accordance with one aspect of the present invention, output signal 60A suitably comprises a series of short bursts coinciding with each zero crossing of line signal 105. Output signal 60A is suitably applied to phase lock loop circuit 62 and to counter circuit 64. Moreover, inasmuch as AC input signal 105 exhibits two zero crossings per cycle, output signal 60A suitably exhibits a frequency equal to twice that of the input line frequency ($2F_{line}$).

Phase lock loop circuit 62 suitably multiplies output signal 60A by a predetermined integer value n, where n may be any suitable value, for example n=1024. Consequently, output signal 62A generated by phase lock circuit 62 exhibits a frequency $nF_{line}$, which is applied to counter 64 and oscillator 90. In this way, switch 84, which operates at a frequency controlled by oscillator 90, is phase-locked with respect to various feedback loops used to control the duty cycle of switch 84.

Counter circuit 64, ROM 66, and DAC 68 suitably cooperate to generate a synthesized current reference waveform which is phase locked with respect to AC input signal 105, yet which exhibits an ideal half sine waveform; that is, the output of DAC 68 essentially corresponds to a pure, noise free representation of AC input signal 105.

More particularly, ROM 66 suitably comprises a memory array comprising a predetermined number of data values representative of the amplitude of an ideal sine curve over a predetermined phase interval. In a preferred embodiment, ROM 66 suitably stores values of a pure sine wave for a phase interval of $\pi/2$, or one-quarter of a pure sine wave period. While the data in ROM 66 may be selected to define a predetermined portion of a sine wave with any suitable resolution, in the illustrated embodiment ROM 66 suitably comprises an eight-bit memory array, such that $2^8$=256 data points are stored in ROM 66.

Counter circuit 64 suitably comprises an up-down counter having a modulo corresponding to the number of data values representing the reference wave form stored within ROM 66. Thus, counter circuit 64 may be configured to increment from 0 to 255, thereby sequentially addressing each data value stored in ROM 66; counter circuit 64 may suitably be configured to thereafter count down to sequentially address the data values stored within ROM 66 in reverse order. By repeating this process, ROM 66 advantageously outputs data values representative of a half sine wave, phase-locked to AC input line 105.

The output of ROM 66 is applied to DAC 68, such that an analog output signal of the form $V_{peak} \sin(\omega t)$ is applied by DAC 68 to multiplier 48.

Multiplier circuit 48 suitably multiplies output signal 68a from DAC 68 together with RMS output signal 60c and error signal 48a, and applies the result to differencing amplifier 50.

With respect to the fourth feedback parameter, current sensor 56 detects the current level $i_{out}$ through the load and applies a proportional signal to filter 94 which outputs a corresponding signal 94a to differencing amplifier 50. Differencing amplifier 50 subtracts signal 94a from the output of multiplier circuit 48a, and applies the difference to switch 114.

Oscillator circuit 90 is phase-locked to AC input line 105 and oscillates at a multiple n of the line frequency. Oscillator 90 causes flip-flop 98 to close switch 84 at the beginning of each cycle at a frequency of $nf_{line}$; ramp generator 92 suitably applies a linear ramp signal, also at a frequency of $nF_{line}$ to a first input of comparator 100, whereupon this ramped signal is compared with the output of amplifier 102 which is applied to the second input of comparator 100. The value of the output signal from amplifier 102 determines the point within the period p of switch 84 ($p=1/nf_{line}$) at which the output of comparator 100 causes flip-flop 98 to open switch 84. Thus, the value of the voltage signal output from amplifier 102, as translated through comparator 100 and flip-flop 98, determines the duty cycle of switch 84 in accordance with, inter alia, the four feedback loops discussed above.

The switching element comprising switch 84 may comprise any suitable active device, for example a bipolar, MOSFET, and the like, as described more fully in co-pending U.S. application Ser. No. 08/021,780, filed Feb. 23, 1993 and in international application No. PCT/US93/07974, filed Aug. 24, 1993.

In accordance with a further aspect of the present invention, battery 72 is suitably charged off the $V_{out}$ line, under the control of charger 74.

Figure 11:
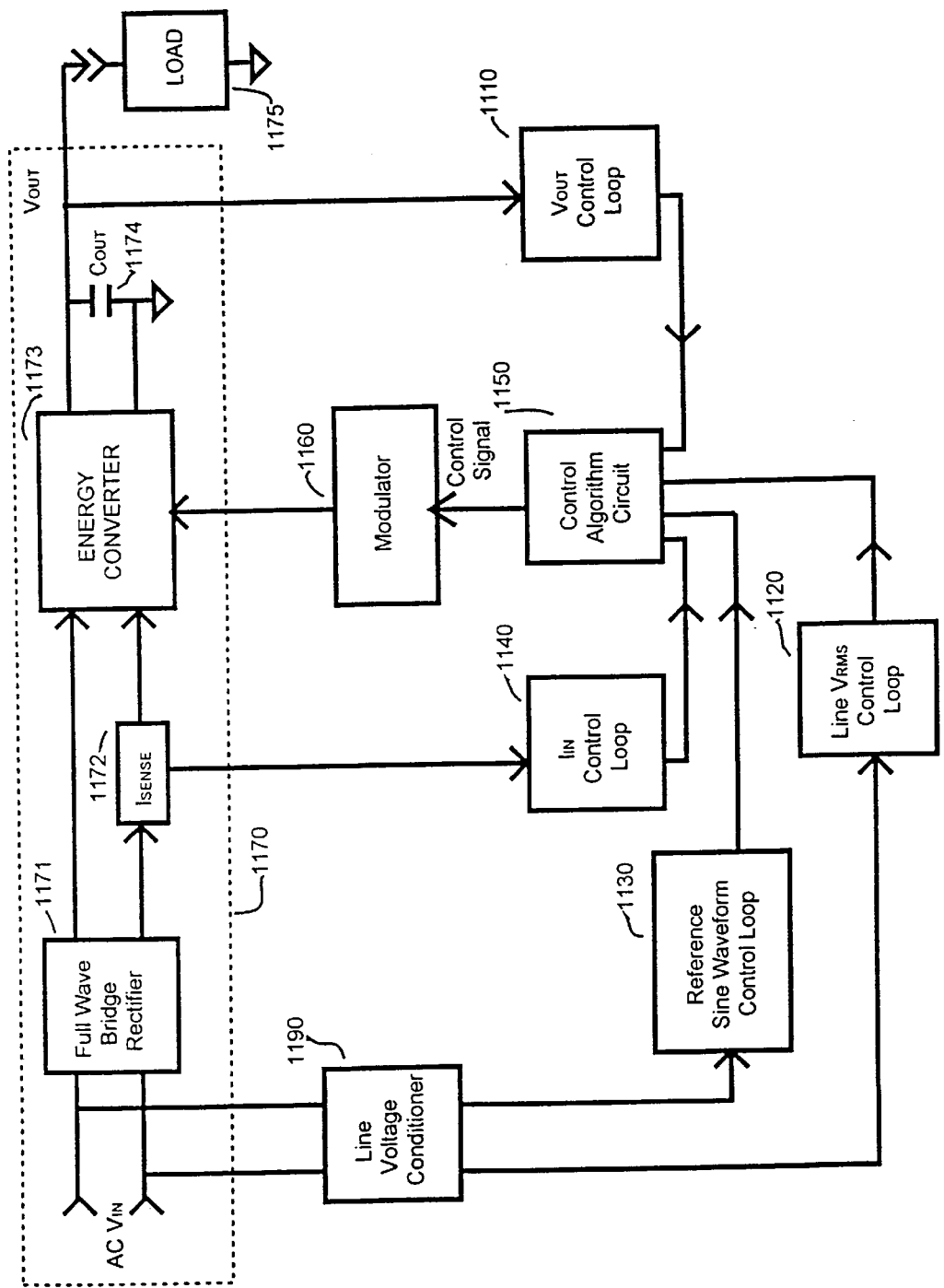
FIG. 11 is a block diagram of the multiple loop configuration to execute solutions for the derived system equations.

The multiple control loop configuration which executes the solutions to the heretofore derived system equations constitutes the basic control algorithm. The loops (1110, 1120, 1130, 1140) are shown in FIG. 11, which for continuity, uses the previous exemplary embodiment of a non isolated boost type configuration. The four input parameters and their loops (1110, 1120, 1130, 1140), which feed the basic control algorithm 1150, which controls the modulator 1160, which in turn controls the energy converter 1173, incorporated in the power converter 1170, all, constitute a boost type AC-DC converter for this example. The first loop 1110, controls the input current ($I_{IN}$), proportionately to a difference value of the output voltage ($V_{OUT}$). The second loop 1120, uses the inverse of the square of the RMS value of the input AC line voltage to control the input current. An absolute value synthesized sine wave locked to the line phase also controls $I_{in}$ proportionately, in the third control loop 1130. Last, $I_{IN}$ 1140 is used to control the maximum current drawn, both over the line sine wave period, but cycle by cycle of the modulation frequency and while itself is being controlled by the first three loops, 1110, 1120, 1130.

Multiple embodiments include all analog to all digital implementations, including combined analog and digital variants. The transition from analog to digital including combined analog and digital implementations which are characterized by different physical implementations of the same basic control algorithm.

Execution of the basic control algorithm is determined by the characteristics of the elements comprising the particular embodiment. Certain of the embodiments incorporate differing proportions of software, firmware and hardware, whose proportion depends on the elements comprising the particular embodiment. Selected embodiments incorporating software and/or firmware maybe adaptive to external control such as illustrated in the three phase implementation of FIG. 10. Selected embodiments may not include either firmware and software.

Exemplary embodiments of the hierarchy covering the range from fully analog to fully digital are described as follows. Distinctions between the several embodiments spanning the fully analog to the fully digital implementations, where some or all control algorithm functions maybe incorporated into a single integrated circuit or hybrid module, illustrate an exemplary set of logical sequences in the execution of the control algorithm as shown in the accompanying block diagrams.

Figure 12:
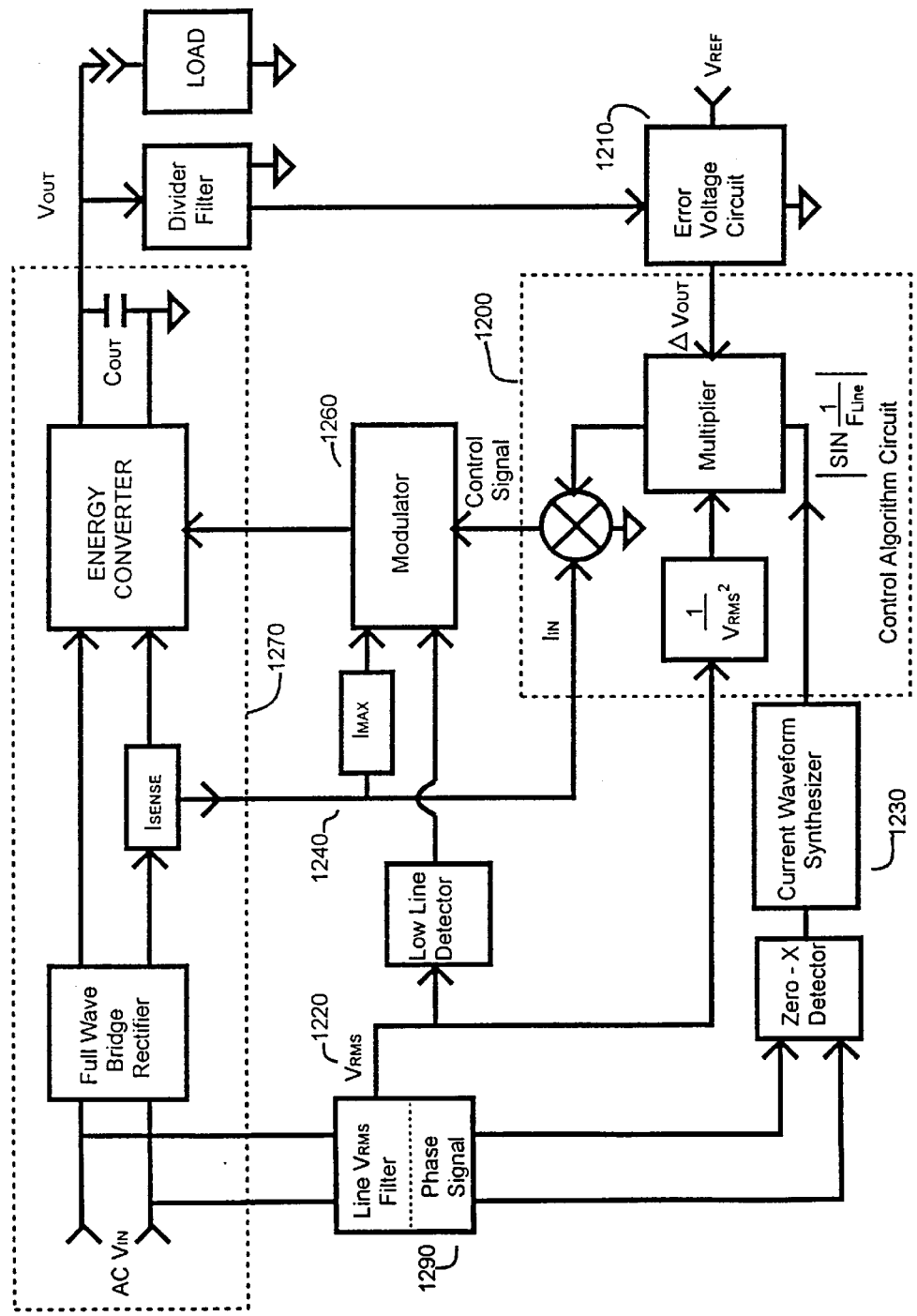
FIG. 12 is a block diagram of a boost type AC-DC power converter.

The block diagram FIG. 12, shows the over all exemplary embodiment example of a boost type AC-DC power converter with the power converter 1270 being modulated by modulator 1260, which is controlled by the control algorithm circuit 1200. The loop signals are fed into the control algorithm circuit 1200, from the output voltage error circuit 1210, the line $V_{RMS}$ filter 1220, the absolute sine waveform 1230 synchronized to the input line and the input current 1240.

Physical implementation of the control algorithm will be given in the following three FIGS. 13, 14, and 15. The implementations will be a discrete analog one (FIG. 13), a digitally computed one (FIG. 14), and a single integrated circuit (FIG. 15). The following are brief descriptions of the different implementations of the exemplary embodiments.

Figure 13:
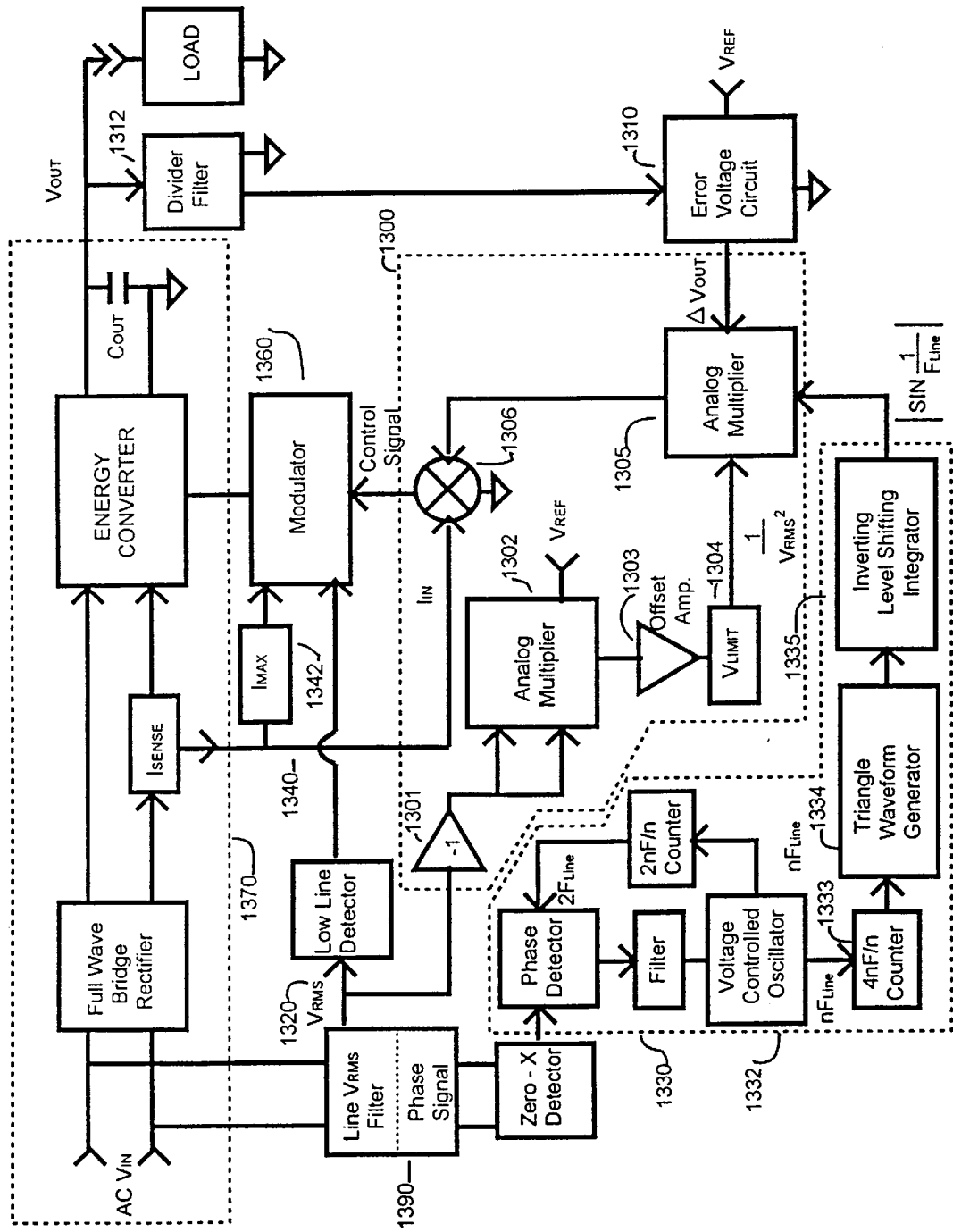
FIG. 13 is a block diagram of discrete components to execute the control algorithm using analog techniques.

FIG. 13 executes the control algorithm using analog techniques in a properly connected group of discrete components. The power converter 1370 is modulated by the modulator 1360, which is in turn controlled by the control algorithm circuit 1300. The control algorithm circuit is constructed from an inverting amplifier 1301, which feeds the inverted $V_{RMS}$ signal into two multiplier input ports of multiplier 1302, which has $V_{REF}$ 1307 feeding a third multiplier port. The multiplier 1302 product is offset in amplifier 1303, whose output is limited by limiter 1304, which feeds the inverse square of $V_{RMS}$ to analog multiplier 1305. Error voltage circuit 1310 supplies D $V_{OUT}$ to another multiplier 1305 port. The absolute value of a sine wave locked to the line phase, which feeds into the third port of multiplier 1305, is generated from an analog sine waveform synthesizer 1330, driven by a voltage controlled oscillator 1332, phase locked to the AC line phase. The oscillator=s 1332 output is divided down 1333 to drive a triangle waveform generator 1334 whose output is integrated, inverted and level shifted 1335 to supply analog multiplier 1305. The output of analog multiplier 1305 is differenced with $I_{IN}$ to provide the control signal to modulator 1360.

Figure 14:
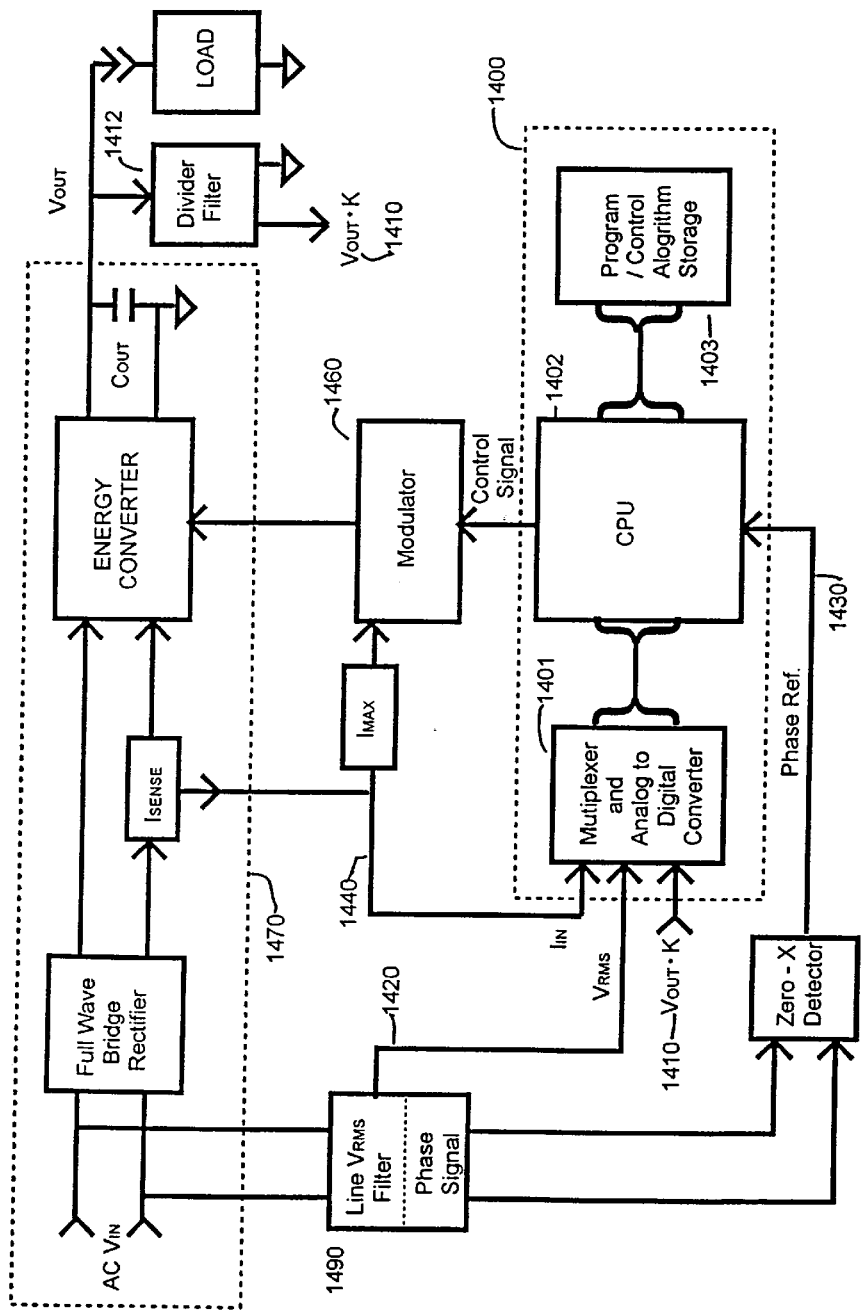
FIG. 14 is a block diagram of components employing a fast CPU to execute a programmed version of the control algorithm stored in memory.
Figure 15:
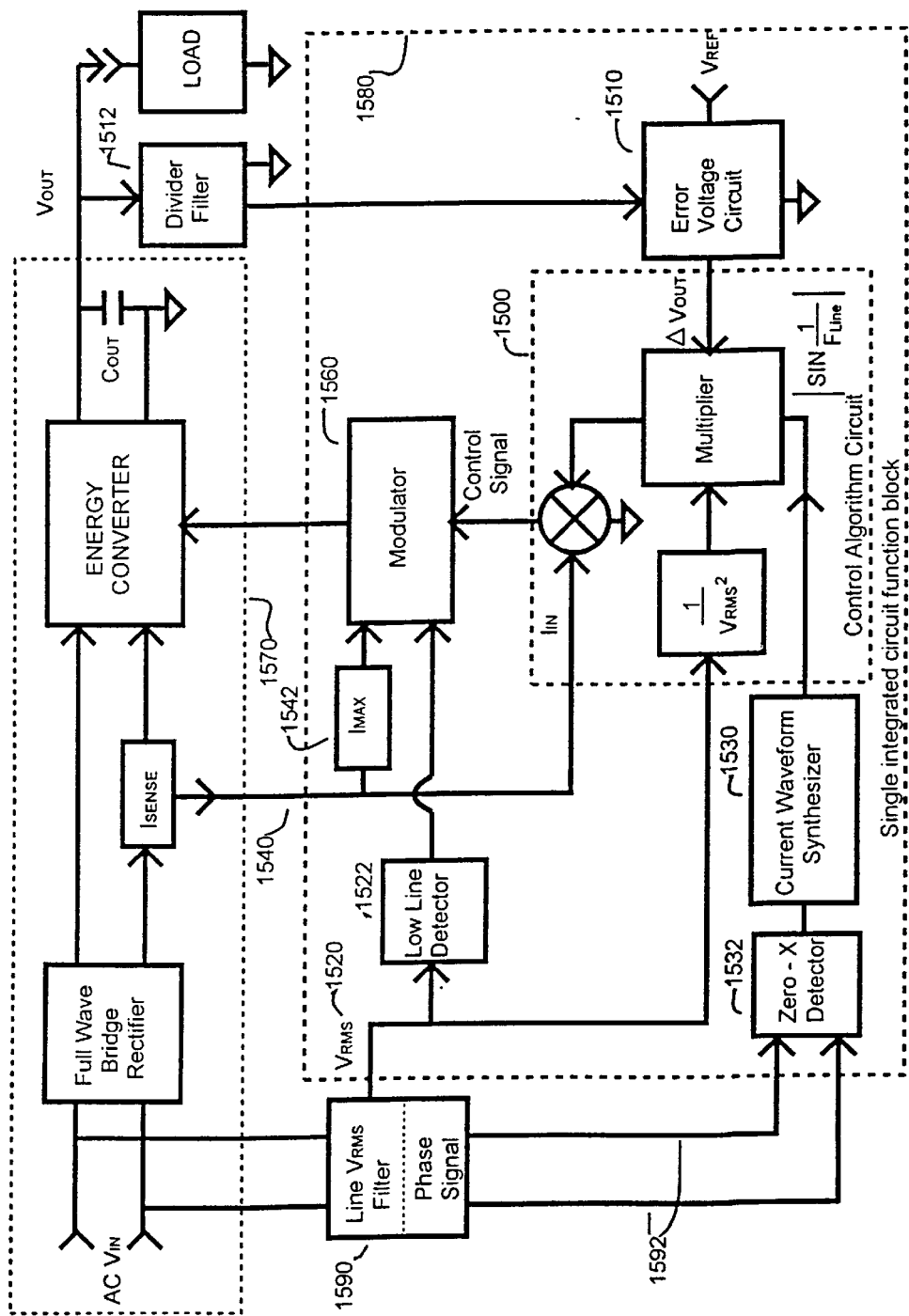
FIG. 15 is a block diagram of a chip incorporating all but a few of the elements of the AC-DC converter boost type configuration.

FIG. 14 uses a fast CPU 1402 executing a programmed version of the control algorithm stored in memory 1403. The various loop input values (1410, 1420, 1440) are digitized in a multiplexe/analog to digital converter 1401, which then inputs the digitized values to the CPU's 1402 registers. Line phase signal 1430 is already a digital logic signal. The CPU's 1402 control signal can be of a direct pulse width nature or a digital value. A digital value would require a converter and summing (not shown) with $I_{IN}$ 1440 to provide the control signal to the modulator. The modulator controls the power converter 1470. FIG. 15 is still yet another implementation of the exemplary embodiment of an AC-DC converter.

The single integrated circuit functions 1580 of FIG. 15 represent a chip which incorporates all but a few of the elements of the AC-DC converter boost type configuration. The divided and filtered $V_{OUT}$ 1512, $V_{RMS}$ 1520, $I_{IN}$ 1540 and the phase signal 1592 are chip inputs, with the power converter 1570 control signal the output. Control algorithm circuit 1500, zero-X detector 1532, waveform synthesizer 1530, error voltage circuit 1510, modulator 1560, $I_{MAX}$ 1542, and low line detector 1522 are all integrated into the circuit.

The multiple configurations of FIGS. 6, 12, 13, 14, 15 of the exemplary embodiment of an AC-DC converter of a boost type, provides a small sample of the possible implementations. This same range of possible implementations techniques is also possible for other embodiments of this invention. Further these implementations and embodiments can be extended to polyphase configurations.

In accordance with a further embodiment of the present invention, the synthesized reference waveform technique may be advantageously applied in the context of a three-phase power distribution system.

Three-Phase Embodiment

Referring now to FIGS. 6–10, the technique of generating a synthesized current reference waveform for use in controlling the duty cycle of a switched energy transfer circuit will now be described in conjunction with a polyphase power distribution system.

Polyphase power distribution systems are generally well known. In particular, three-phase power distribution systems are quite prevalent. Moreover, it is generally understood that three-phase power distribution systems may be implemented in either a wye ("Y") or delta configuration. For simplicity, the polyphase implementation of the subject invention is hereinafter described in conjunction with a delta connected three-phase distribution scheme, it being understood that the principles set forth herein are generally applicable to any three-phase configuration and, indeed, to any polyphase arrangement as well.

The increasing use of capacitive input DC power supplies has resulted in the generation of increased harmonics which are introduced into three-phase power distribution systems. For example, charging systems for electrical storage battery systems, particularly for use in connection with electric vehicles, are anticipated to become more and more prevalent in the near future.

In addition, the proliferation of electric motors as high power consumption loads in three-phase systems is increasing. The need to control the speed of such motors has led to the introduction of numerous variable drive systems for these motors. Initially, silicon controlled rectifiers (SCRs) were used as a speed control mechanism. However, SCR speed control systems introduced severe high frequency (RF) harmonic distortions into the AC service line, in part resulting from the extremely fast switching edge at the start of conduction of the SCRs, exacerbated by the direct connection of the SCRs to the input power lines. The SCR harmonics not only waste energy in the load by unnecessarily heating the motor core, but also cause radio interference problems, e.g., plugging of other motor controllers connected to the same distribution system.

SCR systems are characterized by nonlinear current drawing characteristics, as well as exhibiting a high inductively reactance impedance component which manifests as a current phase shift in the input power lines, resulting in a poor power factor.

More recent speed control systems surround the use of bipolar output drivers such as those used in class D (switching mode power amplifier) systems. The use of these bipolar output drivers has reduced the high frequency harmonics and have increased the power factor at the load by reducing the current phase shift attributable to the load. This is in part due to the fact that the switching rise time of the device as well as the motor reactance reflection are decoupled from the input AC power line by the DC power supply converter. These bipolar systems, however, require large DC power supplies for operation. The use of capacitive input DC supplies, while reducing spurious RF line noise and improving power factor, have nonetheless dramatically increased the crest factor (peak current/RMS current), for example by an order of magnitude over that generated by previous SCR systems. The nonlinear behavior of the DC power supply (AC/DC converter) results in very large odd high harmonic currents reflected back into the AC input power lines.

Just as with single-phase systems, the presence of large odd high harmonic currents in the AC supply lines have a deleterious effect on the voltage step up and step down transformers typically employed in the context of known power distribution systems. More particularly, core losses are proportional to the square of the harmonic frequencies; hence, even relatively low amplitude harmonics exacerbate core loss problems due to their high frequencies and the fact that the loss is proportional to the square of the frequency.

In three-phase power distribution systems, harmonics which are out of phase with respect to each other tend to cancel one another at the supply transformer. In contradistinction, current harmonics which are multiples of three tend to have an additive effect, further compounding energy losses in the transformer core. This phenomenon makes the reduction of the third, ninth, and higher order multiples of three (i.e. $3^n$, where n is an integer) particularly important in three-phase power distribution systems.

Figure 6:
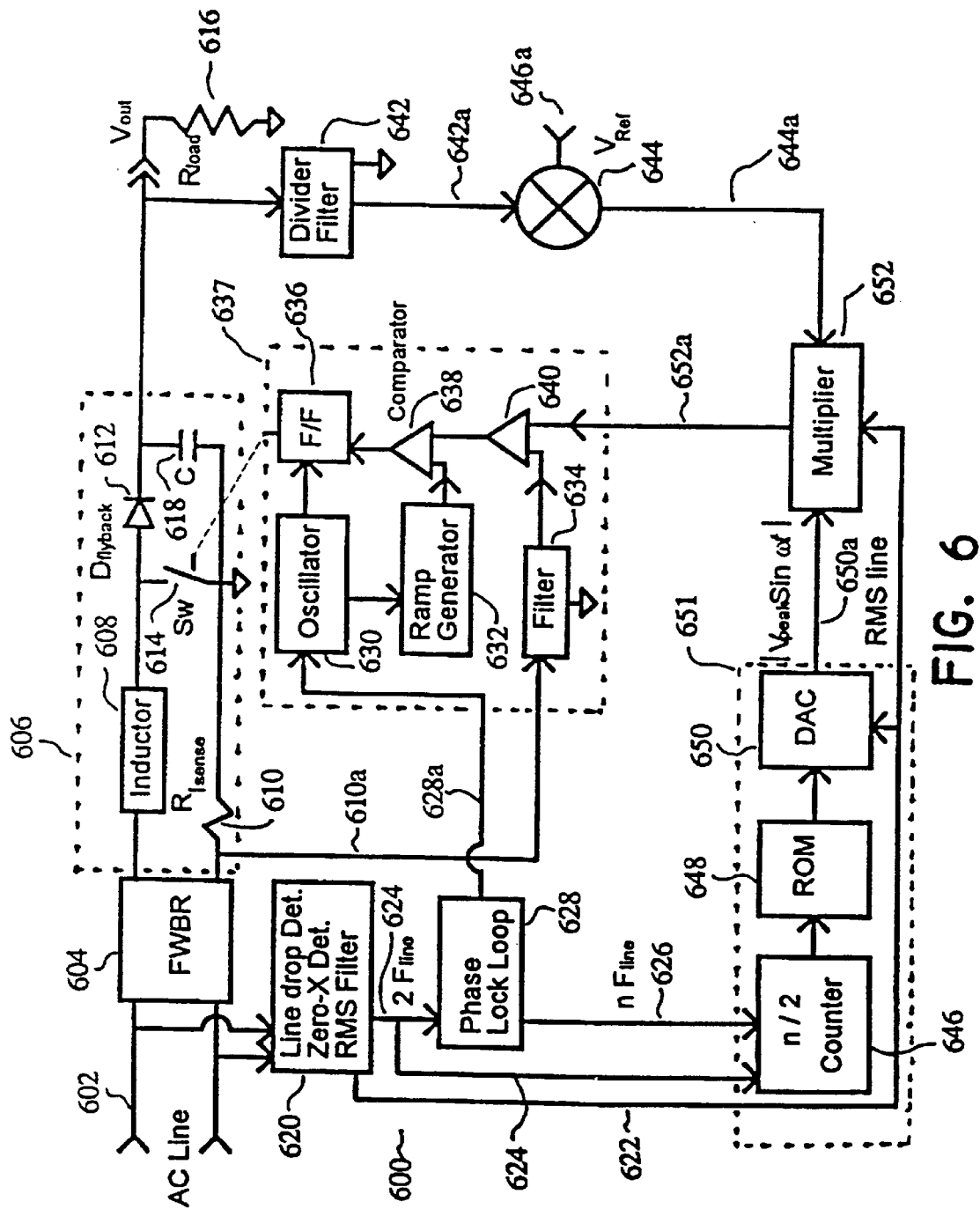
FIG. 6 is an alternate embodiment of the controlled power distribution circuit of FIG. 5.

Referring now to FIG. 6, an alternative embodiment of an energy transform system employing a synthesized current reference waveform to eliminate line harmonics is set forth in the context of a AC/DC converter system 600. System 600 will first be briefly described to highlight various features thereof which are particularly important in the context of a three-phase implementation of the present invention, as described in greater detail in conjunction with FIGS. 7–10.

Power distribution system 600 suitably comprises an AC input line 602, for example an electrical power distribution line from a public utility. Input line 602 suitably carries a full sinusoidal voltage waveform. Input line 602 is applied to a rectifier circuit 604, which outputs a rectified half sine wave to an energy transform circuit 606 analogous in function to converter 22 discussed above in conjunction with FIG. 3.

Power distribution system 600 further comprises a characteristic detection circuit 620, a phase-lock circuit 628, a reference waveform generator circuit 651 configured to output a current reference waveform to a multiplier 652, a PWM control circuit 637, a divider circuit 642, and an output voltage error circuit 644.

Reference waveform generator circuit 651 suitably comprises a counter circuit 646, a ROM 648, and a DAC 650. PWM control circuit 637 suitably comprises an oscillator 630, a ramp generator 632, a filter 634, an amplifier 640, and a comparator 638 figured to output a control signal to a flip-flop 636 which, in turn, controls the duty cycle of energy transfer circuit 606. More particularly, energy transfer circuit 606 suitably comprises a flyback inductor 608, a switch 614 coupled to flip-flop 636, flyback diode 612, and a capacitor 618.

As previously discussed, although energy transfer circuit 606 is implemented with a flyback conductor, flyback diode, and capacitor combination in the illustrated embodiment, it will be understood that any suitable energy transfer mechanism which maintains a high power factor (e.g. near unity) and which reduces nonlinear current drawing characteristics at the load are equally applicable in the context of the present invention.

With continued reference to FIG. 6, input signal 602 is suitably full wave rectified by bridge 604, supplying a positive going half sine wave to inductor 608 of the power transfer (converter) circuit 606. In addition, characteristic detection circuit 620 derives zero crossing information, root mean square (RMS) voltage information, and low voltage level detection information from input line 602. The zero crossing detector comprising characteristic detection circuit 620 suitably provides an output signal 624 (at a frequency equal to two times the frequency of input line 602) to phase-lock loop circuit 628 and counter circuit 646. Phase-lock loop circuit 628, in turn, outputs a signal 628A at a frequency of $nF_{line}$ to oscillator circuit 30. In this regard, a loop time constant is suitably selected to be over 60 timing pulses, to thereby reduce problems attributable to noise present on input line 602.

Signal 626, operating at $nF_{line}$, is counted by counter circuit 646 which supplies ROM 648 with sequential addressing signals to thereby retrieve from ROM 648 output data representative of a corresponding ideal sine wave. The amplitude information stored in ROM 648 is sequentially applied to DAC 650, thereby mapping a linear count into a half sine wave function which drives DAC 650 resulting in an analog half sine output 650 which may be represented as the absolute value of: $V_{peak} \sin(\omega t)$. Output signal 650A is applied to multiplier 652.

The foregoing synthesized current reference waveform is nearly ideal and, as such, does not require filtering to eliminate noise or other harmonics which may be present on reference waveforms of the type used in prior art systems. This is particularly advantageous in that a reference derived from, e.g., a line voltage waveform is difficult to effectively filter, in part because a typical band pass filter in a line voltage referenced system would typically result in phase shifting of the current with respect to the input line voltage, thereby decreasing the system power factor and, hence, degrading overall efficiency. Moreover, such a filter would tend to introduce additional harmonics because of its transient response characteristics and transients on the line stimulating the filter to ring. Because of the difficulties associated with effectively filtering a reference waveform derived from the input line voltage, prior art systems typically used an unfiltered reference waveform permitting line voltage harmonics of the referenced waveform to be amplified by the gain of the current control loop, further degrading harmonic performance of the circuit.

A synthesized waveform such as that described herein effectively decouples the converter (e.g. converter 606 of FIG. 6) from the feedback attributable to the modulation of the reference waveform by the supply waveform across the line impedance as current draw increases. Indeed, the use of a synthesized current reference waveform could theoretically produce a supply with an ideal resistive input characteristic, virtually eliminating harmonics.

With continued reference to FIG. 6, characteristic detection circuit 620 suitably generates an RMS signal 622 indicative of the RMS voltage value of input line 602. Signal 622 is also suitably applied to multiplier 652. In this regard, it may be advantageous to square the RMS voltage value present on input line 602, for example in circuit 620 or in multiplier 652. The squared RMS signal is suitably used to provide a normalizing signal to the current reference waveform (i.e. signal 650A), to thereby compensate the reference waveform for variations in input line voltage signal 602. In addition, RMS signal 622 may be advantageously filtered, for example using a low pass filter to thereby reduce line noise. Such a filter may be suitably implemented in circuit 620 or 652, as desired, and may suitably exhibit a corner frequency less than $F_{line}$ (the frequency of AC input line 602); moreover, the value of the corner frequency and the slope of the filter roll-off may be suitably used to determine the second harmonic leakage factor. That is, the leakage of second harmonics through the RMS filter may generate higher harmonics when the signal is squared; hence, the synthesized waveform described herein may not necessarily totally reduce line harmonics to zero.

The use of a low line detector circuit within characteristic detection circuit 620 suitably measures the RMS value of the input line voltage and generates a low line signal when the RMS value drops below a preset level.

Converter circuit 606 transforms the output of rectifier 604 by stepping up the line voltage and charging output capacitor 618 which, as described above, is configured to supply current to load 616. In the illustrated embodiment, the output voltage $V_{out}$ will be greater than the peak phase voltage.

A feedback signal (error signal) 644A is also suitably generated by dividing and filtering $V_{out}$ at filter circuit 642 and subtracting an output 642A from a predetermined reference voltage $V_{ref}$ 646 at a subtractor 644. Error signal 644A is also applied to multiplier 652, and suitably sets the response of $V_{out}$ to load transients. With regard to the filter comprising filter circuit 642, a moderate filter corner frequency may be employed, provided that the frequency is substantially less than $nF_{line}$.

The output signal 652A of multiplier 652 is applied to one input of a different amplifier 640. In addition, an output signal 610A generated by current sensing resister 610 is filtered at filter 634 and also applied to the second input of the difference amplifier 640. The output of amplifier 640 is fed to the comparator 638 and, in conjunction with the ramp output, is ultimately used to control the duty cycle of switch 614. Filter 634, filter 634 is suitably characterized by a high corner frequency less than $nF_{line}$.

More particularly, oscillator 630 causes flip-flop 636 to close switch 614 at the beginning of each cycle of loop frequency $nF_{line}$. Oscillator 630 also drive ramp generator 632, which applies a ramped output to comparator 638. Thus, the value of the output of amplifier 640 (as compared to the output of ramp generator 632) will determine the point within each period of the cycle defined by oscillator 630 (i.e., $nF_{line}$) at which flip-flop 636 opens switch 614, thereby controlling the duty cycle of converter circuit 606.

Moreover, a system protection circuit (not shown) may be conveniently set to respond cycle by cycle at the switching frequency. That is, an over current comparator may be incorporated to limit or stop the PWM duty cycle to prevent output device damage or inductor saturation.

Figure 7:
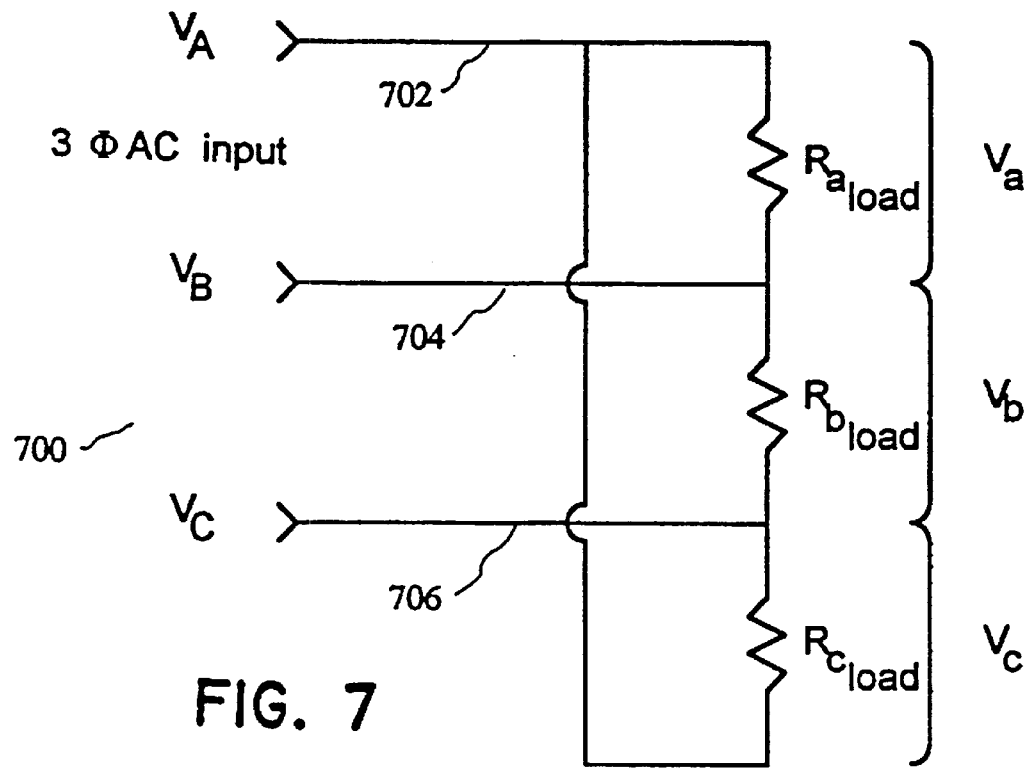
FIG. 7 is a schematic circuit diagram of a delta connected three phase power distribution system.

Referring now to FIG. 7, a typical three-phase power distribution system 700 suitably comprises respective lines 702 (corresponding to waveform $V_A$), 704 (corresponding to waveform $V_B$), and 706 (corresponding to $V_C$), to which a three-phase AC input is applied. Thus, the instantaneous line voltage of each phase with respect to ground may be defined as follows:

$$V_A = V_{PKline}\sin(\omega_{line}t),$$

$$V_B = V_{PKline}\sin\left(\omega_{line}t + \frac{2\pi}{3}\right),$$

$$V_C = V_{PKline}\sin\left(\omega_{line}t + \frac{4\pi}{3}\right)$$

where $V_{PKline}$ is the peak line voltage.

The voltage between any two of these phases, that is the interphase voltage, may thus be defined as follows:

$$V_a = V_A - V_B = V_{PKline}\left[\sin(\omega_{line}t) - \sin\left(\omega_{line}t + \frac{2\pi}{3}\right)\right]$$

$$V_b = V_B - V_C = V_{PKline}\left[\sin\left(\omega_{line}t + \frac{2\pi}{3}\right) - \sin\left(\omega_{line}t + \frac{4\pi}{3}\right)\right]$$

$$V_c = V_C - V_A = V_{PKline}\left[\sin\left(\omega_{line}t + \frac{4\pi}{3}\right) - \sin(\omega_{line}t)\right]$$

where a, b, and c indexes indicate the interphase values defined above. Reducing the above equations and defining $$V_{PK_\phi} = \sqrt{3}\, V_{PKline}$$

then $$V_a = V_{PK_\phi}\sin\left(\omega_{line}t + \frac{\pi}{6}\right)$$

$$V_b = V_{PK_\phi}\sin\left(\omega_{line}t + \frac{5\pi}{6}\right)$$

$$V_c = V_{PK_\phi}\sin\left(\omega_{line}t + \frac{9\pi}{6}\right)$$

The interphase voltage is $\sqrt{3}$ times the line to ground voltage and its phase leads the first index line phase by $\pi/6$ or 30 degrees.

The characteristics of a 3φ full wave bridge rectifier (FWBR) DC power supply are fundamentally similar to those of a single-phase supply.

Figure 8:
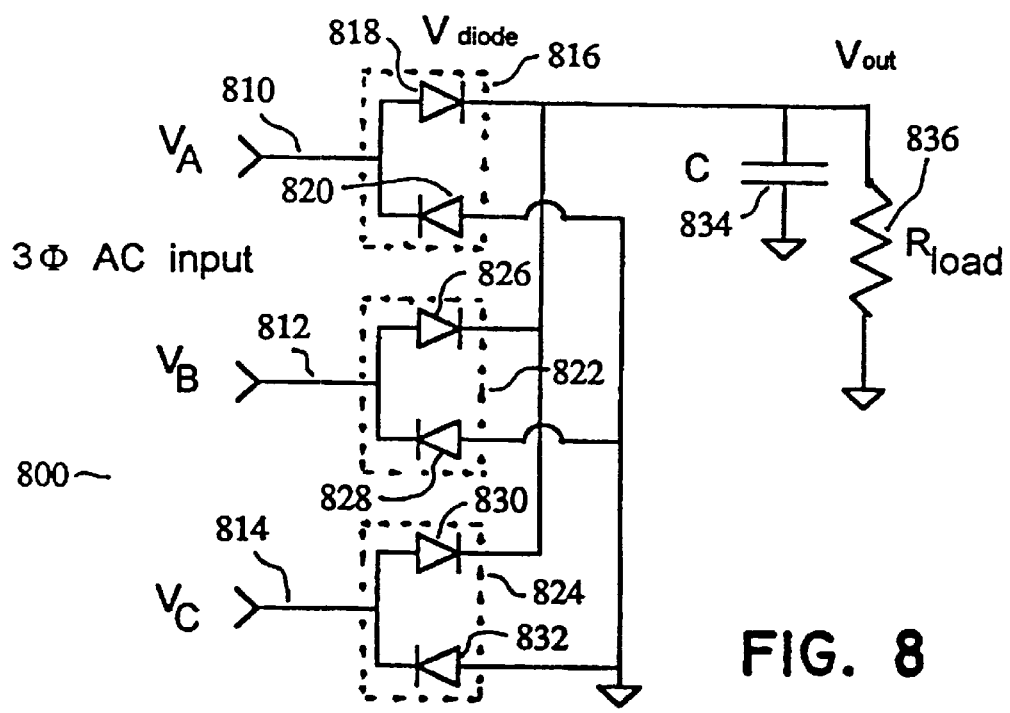
FIG. 8 is an exemplary three phase AC/DC power supply circuit.

Referring now to FIG. 8, a simple delta wired three-phase AC/DC supply circuit 800 suitably comprises a first branch 810, a second branch 812, and a third branch 814 to which a three-phase AC input is applied. Voltage signal $V_A$ on branch 810 is suitably rectified by a rectifier circuit 816; signal $V_B$ (branch 812) is suitably rectified by a rectifier circuit 822; and signal $V_C$ (branch 814) is suitably rectified by a rectifier circuit 824. Each of the foregoing rectifier circuits suitably comprises two diodes, as is known in the art. A common capacitor 834 suitably functions to stabilize $V_{out}$ to the load 836, as is also known in the art.

The desirability of a three-phase DC supply over a single-phase DC supply can in part be attributed to the fact that the ripple frequency is $6F_{line}$ in the three-phase supply, as opposed to a ripple frequency on the order of $2F_{line}$ for a single-phase supply. This higher ripple frequency reduces the output filter requirements for a given output ripple value and power level. As discussed briefly above in connection with FIG. 3, the bias of the output voltage on the rectifier diodes restricts conduction of the diodes to phase angles wherein the line input voltage exceeds two diode voltage drops plus the output voltage. When current flows through the diodes, its peak value is essentially limited only by the input line impedance. This nonlinear conduction behavior is the source of high odd harmonics in the input line current. Moreover, the crest factor in a three-phase system as compared to a single-phase system is reduced, for example on the order of a factor of three for an identical input current and load. Current harmonics are proportionately reduced as well.

As stated above, however, transformer core losses are a function of the square of the frequency of line harmonics, resulting in substantial harmonic energy lost as heat in the transformer cores. Harmonic current cancellation of odd harmonics in three-phase transformer cores occurs only for harmonics which are not a multiple of three; conversely, current harmonics which are a multiple of three are additive due to their common phase. These "three multiple" current harmonics develop circulation currents (e.g., caused by the magnetic flux changes in the core), which also dissipate as heat. It is thus quite desirable to control harmonic reduction in three-phase systems in order to maintain satisfactory power distribution efficiency.

Before applying the foregoing inventive techniques to a three-phase system, it is instructive to note that using the input line voltages ($V_A$, $V_B$, $V_C$) as reference waveforms in three-phase systems is particularly problematic inasmuch as the interphase current typically leads the line phase by 30 degrees ($\pi/6$ radians). Thus, it is extremely difficult to maintain phase-stable references in a three-phase system. Moreover, the introduction of a phase shifting network would inevitably produce transient induced harmonics in addition to passing any line voltage harmonics already present on the input supply line. The synthesized waveform techniques of the present invention, when properly applied in a three-phase context, provide nearly perfect phase stability and current waveform since only timing information (e.g., zero crossing or peak detection) is obtained from the input lines.

Figure 9:
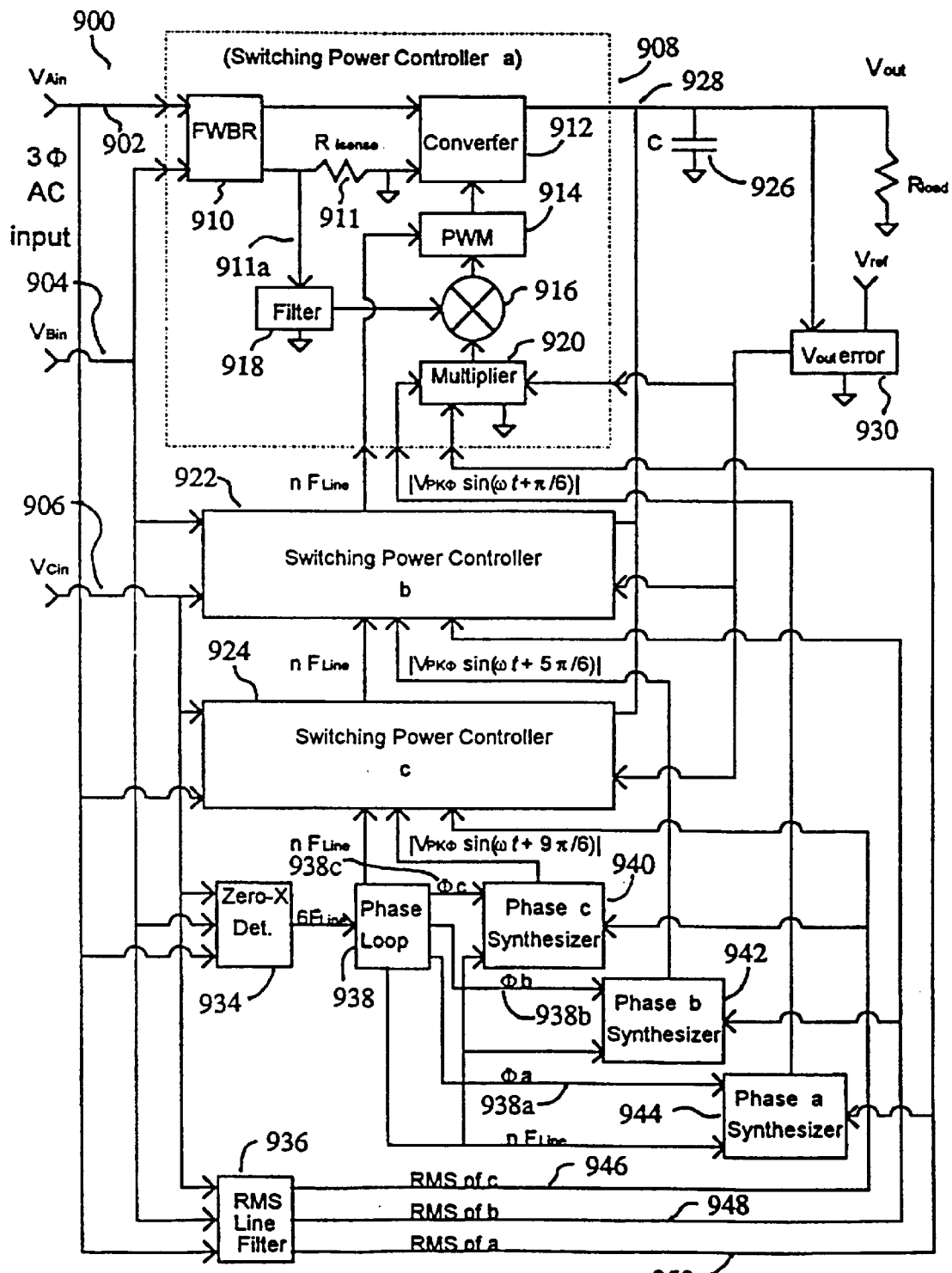
FIG. 9 is a schematic block diagram of a synthesized reference waveform controlled energy transfer circuit implemented in a three phase contest.

Referring now to FIG. 9, an exemplary three-phase power distribution circuit 900 employing the reference waveform synthesis techniques of the present invention will now be described.

The implementation of a three-phase low harmonic DC power supply in the context of the present invention is particularly advantageous with respect to the use of synthesized reference waveforms to correct for current waveform distortions.

More particularly, system 900 suitably comprises a first branch 902 ($V_{A\ in}$), a second branch 904 ($V_{B\ in}$), and a third branch 906 ($V_{C\ in}$) to which a three-phase AC input is applied. Each of respective branches 902, 904 and 906 is suitably connected to a corresponding PWM control circuit. More particularly, branch 902 ($V_{A\ in}$) is suitably input to PWM controller 908 and PWM controller 924; branch 904 ($V_{B\ in}$) is applied to PWM controller 908 and PWM controller 922; and branch 906 ($V_{C\ in}$) is applied to PWM controller 922 and PWM controller 924. In this way and as set forth in the foregoing equations and as also illustrated in FIG. 7, respective interphase voltage signals V$a$, V$b$, and V$c$ may be conveniently derived.

Respective PWM controllers 908, 922, and 924 are suitably identically constructed; however, for clarity, only PWM controller 908 is shown in detail in FIG. 9. More particularly, controller 908 suitably comprises a rectifier circuit 910, a current sensing circuit 911 and a current sense output filter 918, a multiplier 920, a differencing amplifier 916, a PWM generating circuit 914, and a converter 912. The respective outputs of controllers 908, 922, and 924 are suitably output to node 928 for application as $V_{out}$ across the load, using a common filter capacitor 926.

With continued reference to FIG. 9, three principal features are of primary significance in the context of the three-phase embodiment shown in FIG. 9.

First, an additional pair of diodes, in contradistinction to the single pair of diodes illustrated in respective rectifier circuits 816, 822, and 824 in FIG. 8, is suitably used for each interphase waveform, resulting in a full wave rectifier bridge 910 for each interphase line pair. For each interphase line pair, the positive going half sine waves from rectifier 910 are applied to converter 912 in a manner analogous to that described above in conjunction with the single-phase embodiment. Indeed, converter 912 also functions analogously to that described above in conjunction with the single-phase embodiment. Common filter capacitor 926 permits each converter to dump its charge at a common potential, namely $V_{out}$, at node 928 independent of the original phase.

Error signal generator 930 suitably generates an output voltage error signal by filtering and dividing the output voltage $V_{out}$ and subtracting it from a stable reference voltage $V_{ref}$. The output of error signal generator 930 is thereafter applied to multiplier circuit 920 of each of respective controller circuits 908, 922, and 924. In this regard, the output error voltage filter comprising error circuit 930 suitably comprises a low pass filter with a pole less than nF/10 to provide good output step response.

Secondly, independent RMS values are advantageously developed for each interphase voltage signal. More particularly, respective branch signals 902, 904, and 906 are suitably applied to RMS line filter circuit 936, whereupon respective output signals 946, 948 and 950 are generated indicative of, respectively, the RMS values of respective interphase voltage signals $V_c$, $V_b$, and V$a$. (Recall that respective interphase voltage signals $V_a$, $V_b$, and $V_c$ represent the differences between various input branch signals 902, 904, and 906, as derived in the equations discussed supra.)

Thirdly, RMS signal 946 is suitably applied to a phase C synthesizer circuit 940, RMS signal 948 is suitably applied to a phase B synthesizer circuit 942, and RMS signal 950 is suitably applied to a phase A synthesizer circuit 944. In addition, zero crossing information relating to each of the interphase voltage signals is developed by zero crossing circuit 934, whereupon zero crossing information is applied, at a frequency of 6F$_{line}$ to phase loop circuit 938. Phase loop circuit 938 is thus locked to the zero crossing pulses.

Phase loop circuit 938 advantageously generates respective interphase synchronizing pulse signals 938A, 938B, and 938C, which signals are suitably $\pi/6$ radians (30 degrees) phase shifted from respective input lines 902, 904, and 906, to thereby lock the current waveform synthesizers to their proper "interphase" phases. In addition, phase loop circuit 938 applies timing pulses at a frequency of nF$_{line}$, to respective phase synthesizer circuits 940–944, such that these synthesizer circuits generate ideal sine wave reference waveforms in a manner analogous to the reference waveform generated by the systems discussed above in connection with FIGS. 4 and 5 in the single-phase embodiment. Moreover, respective synthesizer circuits 940–944 suitably produce absolute sine waves which are normalized by appropriate RMS signals (e.g., respective RMS signals 946–950) applied to the synthesizer circuits from RMS line filter circuit 936, as discussed above.

The synthesized waveforms produced by synthesizer circuits 940–944 are suitably applied to PWM controller circuits 924, 922, and 908, respectively, in a manner analogous to the single-phase embodiment discussed in conjunction with FIGS. 4 and 5. Analogously, respective PWM control circuits 908, 922, and 924 are also synchronized by an nF$_{line}$ from phase loop circuit 938.

As briefly discussed above, each of respective PWM controller circuits 908, 922 and 924 suitably comprises a current sense circuit 911 which generates a current sense signal 911A which is filtered by filter circuit 918 and applied to a differencing amplifier 916. In this way, a filtered input current signal developed across current sensor 911 is summed with the multiplied error signal from error signal generator 930 and the appropriate synthesized wave shape signal to control the duty cycle of converter 912 for each of respective PWM control circuits 908, 922, and 924.

In accordance with a further aspect of the present invention, the availability of three separate power legs in three-phase systems permits the foregoing embodiment to be conveniently adapted for interline load leveling. More particularly, if one of the line phases is voltage sagging, indicating that it is carrying extra current because of poor load distribution on the power grid, the typical response of a constant energy transfer, low harmonic DC power supply would be to increase the interphase currents on those phases to maintain a constant power transfer; however, this tends to further increase the current draw on that input line. While this solution tends to reduce "brown out" problems for the end users, it tends to aggravate the line load imbalance problem.

Figure 10:
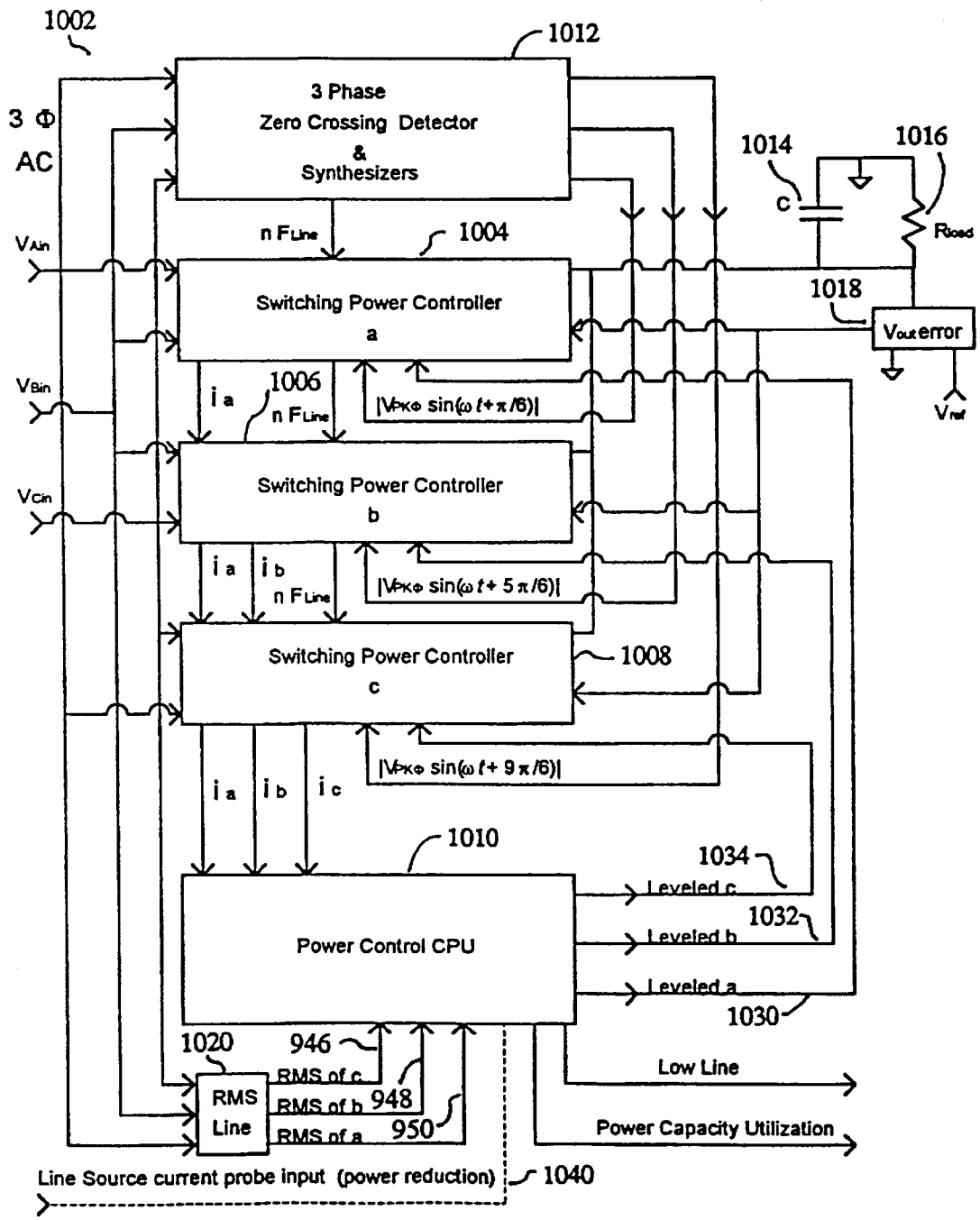
FIG. 10 is a schematic block diagram of the system of FIG. 9 further including load leveling circuitry.

Referring now to FIG. 10, an intelligent controller circuit 1002 suitably comprises respective PWM control circuits 1004, 1006, and 1008 analogous to respective circuits 908, 922 and 924 of FIG. 9, a filter capacitor 1014, load 1016, output error signal generator 1018, and an RMS line detection circuit 1020, generally analogous to the corresponding components discussed above in conjunction with FIG. 9. In this regard, intelligent controller circuit 1002 also suitably comprises an omnibus synthesizer circuit 1012, analogous to the various synthesized waveform generation circuitry discussed above in conjunction with FIG. 9. Intelligent controller circuit 1002 further comprises a power control circuit 1010 configured to effect line load equalizing, as discussed below.

In accordance with a preferred embodiment of the present invention, line balancing may be accomplished by, inter alia, CPU 1010 through the execution of a line balance algorithm, for example in the form of instructions resident within a ROM (not shown) associated with CPU 1010.

More particularly, by summing the squares of each interphase RMS voltage value (e.g., RMS signals 946, 948 and 950) and dividing the sum by three, a squared mean of the RMS values may be determined. CPU 1010 is suitably configured to calculate the difference between the squared mean RMS value and each of the individual squared RMS values, yielding respective delta RMS squared values for each interphase voltage. Dividing each delta RMS squared by its corresponding RMS squared value, and thereafter adding the product thereof to one if the RMS squared value is greater than the mean RMS squared, and by subtracting the product from one if the RMS squared value is less than the mean RMS squared value yields respective leveled values 1030, 1032, and 1034 corresponding to each interphase value. Respective leveled signals 1030–1034 are suitably applied to a corresponding converter within an appropriate one of respective PWM controller circuits 1004, 1006, and 1008. In this way, the mean value moves with all three input line voltages, yet extracts more power from the higher voltage phase and decreases the power drawn from the low line, thereby balancing the sensed line imbalance. Total input power transfer may also be advantageously controlled by scaling the mean RMS squared value.

Total power transfer to control total facility input power may be suitably accomplished through the use of current probes (not shown), for example probes clamped to the incoming facility power lines. An input signal 1040 representative of AC input line source current may be suitably applied to CPU 1010. The maximum permissible current draw may also be stored within RAM or ROM, as appropriate, within CPU 1010, for example in non-volatile memory. CPU 1010 may be suitably configured to reduce the input power draw to the power supply as the total current draw (as represented by signal 1040) approached a maximum permitted value, thereby shedding the supply load as required.

The foregoing load shedding scheme is particularly advantageous in the context of constant voltage loads, for example rechargers of the type used to recharge batteries, for example in the context of battery packs used in electric vehicles.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

I claim:

1. A low line current harmonic power supply, adapted to receive power from an AC line, the power supply including:
    a rectifier responsive to the AC line voltage;
    a capacitor disposed in parallel across the output of the power supply;
    an energy transformation circuit interposed between the rectifier and the capacitor;
    a power switch, responsive to a control signal applied thereto, for selectively energizing the energy transformation circuit;
    a control circuit, for generating the control signal to the power switch; the power supply characterized in that:
        the power supply includes a means, phase-locked to the voltage waveform of the AC line, for synthesizing indicia of a desired input current waveform reference; and
        the control signal to the power switch is derived, at least in part, from the indicia of the desired waveform.

2. The power supply of claim 1, wherein the control circuit comprises:
    a pulse width modulator, responsive to a modulation control signal applied thereto for generating the control signal to the power switch;
    a circuit for generating indicia of the RMS voltage of the voltage waveform of the AC line;
    a circuit for generating indicia of the output voltage of the power supply;
    a circuit for generating indicia of the current from the rectifier; and
    means, responsive to the indicia of the RMS voltage, the indicia of the output voltage, the indicia of the current, and the indicia of the desired waveform, for generating the modulation control signal.

3. The power supply of claim 2, wherein the indicia of the RMS voltage comprises indicia of the inverse of the square of the RMS voltage of the AC line.

4. The power supply of claim 1, wherein the control circuit comprises:
    a pulse width modulator, responsive to a modulation control signal applied thereto for generating the control signal to the power switch;

a first error signal generator for generating an output voltage error signal indicative of the deviation of the output voltage of the power supply from a predetermined reference voltage;

a second error signal generator for generating an RMS error signal indicative of the deviation of RMS voltage of the voltage waveform of the AC line from a predetermined reference value;

a multiplier, responsive to the indicia of the desired waveform, the output voltage error signal, and the RMS error signal;

a current sensor for generating a signal indicative of the current from the rectifier; and a differencing amplifier, receptive of the outputs of the current sensor and the multiplier, for generating the modulation control signal.

5. The power supply of claim 1, wherein the means for synthesizing the indicia of the desired waveform includes:

a characteristic detector, responsive to the AC line voltage, for generating indicia of the occurrence of a predetermined characteristic of the AC line voltage;

a phase lock loop, responsive to signals from the characteristic detector circuit, for generating a signal of a predetermined frequency, phase-locked to the AC line voltage;

a counter, responsive to the phase-locked signal, for generating a count indicative of the phase of the AC line voltage;

a memory, responsive to the phase count, for selectively generating indicia of a desired waveform; and a digital-to-analog converter, responsive to signals from the memory.

6. The power supply of claim 5, wherein the characteristic detector comprises a zero crossing detector.

7. The power supply of claim 1, wherein the power supply resides within a facility and is receptive of indicia of the total facility input power draw, and the power supply comprises:

means for generating indicia of the input power drawn by the power supply;

control means, responsive to the indicia of the total input power and the indicia of the power drawn by the power supply, for reducing the input power drawn by the power supply as the total input power of the facility increases to a predetermined level.

8. A low line current harmonic power supply, adapted to receive power from an AC line, including a predetermined number of phase pairs, wherein the power supply comprises:

a capacitor disposed in parallel across the output of the power supply;

means for generating indicia of the phase of each phase pair of the AC line;

and, for each phase pair:

a rectifier responsive to the AC line voltage on the phase pair;

an energy transformation circuit connected between the rectifier for the phase pair and the capacitor;

a power switch, responsive to a control signal applied thereto, for selectively energizing the energy transformation circuit;

means, responsive to the indicia of the phase of the phase pair, for synthesizing indicia of a desired input current waveform reference; and a control circuit, responsive to the indicia of the desired waveform for the phase pair, for generating the control signal to the power switch.

9. The power supply of claim 8, wherein the power supply further comprises means for generating an indicia of the RMS voltage of each of the phase pairs, and a circuit for generating indicia of the current from the rectifier, and wherein the control circuit comprises:

a pulse width modulator, responsive to a modulation control signal applied thereto for generating the control signal to the power switch;

a circuit for generating indicia of the current from the rectifier; and means, responsive to the indicia of the RMS voltage, the indicia of the output voltage, the indicia of the current, and the indicia of the desired waveform, for generating the modulation control signal, the modulator output comprising the control signal to the power switch.

10. The power supply of claim 9, wherein the means for generating the modulation control signal includes means, responsive to the RMS voltage of each of the phase pairs, for controlling the power transfer from the phase pairs such that more power is drawn from the phase pair with the highest RMS voltage according to a predetermined algorithm.

11. The power supply of claim 8, wherein the control circuit comprises:

a pulse width modulator, responsive to a modulation control signal applied thereto for generating the control signal to the power switch; and wherein the power supply further comprises:

means for generating the indicia of the RMS voltage of each of the phase pairs;

a circuit for generating indicia of the current from the rectifier; and means, responsive to the indicia of the RMS voltage, the indicia of the output voltage, the indicia of the current, and the indicia of the desired waveform, for generating the modulation control signal, the modulator output comprising the control signal to the power switch.

12. The power supply of claim 8, wherein the indicia of the desired waveform comprises indicia of the inverse of the square of the RMS voltage of the AC line.

13. The power supply of claim 8, wherein the means for generating indicia of the phase of each phase pair comprises:

a characteristic detector for generating indicia of the occurrence of a predetermined characteristic in the waveform of the AC line voltage;

a phase locked loop, responsive to the indicia from the characteristic detector, for generating, for each phase pair of the AC line, a signal of a predetermined frequency, phase-locked to the phase pair; and for each phase pair of the AC line, a counter, responsive to the phase-locked signal for the phase pair, for generating a count indicative of the phase of the phase pair.

14. The power supply of claim 1, 4, 8 or 13, wherein the energy transformation circuit comprises an inductor and flyback diode.

15. The power supply of claim 14, further including a bifilar filter interposed between the flyback diode and the capacitor.

16. The power supply of claim 8, wherein:

the power supply includes a first error signal generator for generating an output voltage error signal indicative of the deviation of the output voltage of the power supply from a predetermined reference voltage; and each control circuit comprises:

a pulse width modulator, responsive to a modulation control signal applied thereto, for generating the control signal to the respective power switch;

a second error signal generator for generating an RMS error signal indicative of the deviation of RMS voltage of the voltage waveform of the phase pair from a predetermined reference value;

a multiplier, responsive to the indicia of the desired waveform for the phase pair, the output voltage error signal, and the RMS error signal;

a current sensor for generating a signal indicative of the current flow through the rectifier for the phase pair; and a differencing amplifier, receptive of the outputs of the current sensor and the multiplier, for generating the modulation control signal.

17. The power supply of claim 16, wherein the means for synthesizing the indicia of the desired waveform includes:
    a characteristic detector, responsive to the AC line voltage, for generating indicia of the occurrence of a predetermined characteristic of the AC line voltage;
    a phase locked loop, responsive to signals from the characteristic detector, for generating a signal of a predetermined frequency, phase-locked to the AC line voltage;
    a counter, responsive to the phase-locked signal, for generating a count indicative of the phase of the AC line voltage;
    a memory, responsive to the phase count, for selectively generating indicia of the desired waveform; and
    a digital-to-analog converter (DAC) responsive to signals from the memory.

18. The power supply of claim 17, wherein the characteristic detector comprises a zero crossing detector.

19. The power supply of claim 13, wherein:
    the power supply includes a first error signal generator for generating an output voltage error signal indicative of the deviation of the output voltage of the power supply from a predetermined reference voltage; and
    each control circuit comprises:
        a pulse width modulator, responsive to a modulation control signal applied thereto, for generating the control signal to the respective power switch;
        a second error signal generator for generating an RMS error signal indicative of the deviation of RMS voltage of the voltage waveform of the phase pair from a predetermined reference value;
        a multiplier, responsive to the indicia of the desired waveform for the phase pair, the output voltage error signal, and the RMS error signal;
        a current sensor for generating a signal indicative of the current flow through the rectifier for the phase pair; and
        a differencing amplifier, receptive of the outputs of the current sensor and the multiplier, for generating the modulation control signal.

20. The power supply of claim 1, wherein the means for synthesizing the indicia of the desired waveform comprises:
    a current reference having a phase which tracks the zero crossings of the alternating current line voltage to cause the power supply to exhibit unity power factor with respect to the AC line.

21. The power supply of claim 1, wherein:
    the energy transformation circuit is switched at a high frequency compared with the frequency of the alternating current line; and
    energy contained in the harmonics of the high switching frequency is efficiently transformed into energy of the frequency of the AC line.

22. The power supply of claim 1, wherein a bifilar wound magnetic element is positioned between the energy transformation circuit and the capacitor.

23. The power supply of claim 1, wherein the control circuit is at least one of a phase locked synthesized reference waveform and a secondary voltage control loop.

24. The power supply of claim 21, wherein the high frequency switching is a multiple of the frequency of the AC line.

25. The power supply of claim 22, wherein the bifilar wound element is an inductor.

26. A method of producing a substantially constant output voltage from an AC line without producing substantial line harmonics, comprising the steps of:
    rectifying the voltage across the AC line;
    applying the rectified voltage to an energy transformation circuit;
    applying the output of the energy transformation circuit to an output voltage capacitor; and
    controlling the energization of the energy transformation circuit in accordance with a synthesized waveform phase-locked to the voltage waveform of the AC line to draw input current sinusoidally in phase with input voltage.

27. The method of claim 26, wherein the step of controlling the energization of the energy transformation circuit comprises the steps of:
    generating indicia of the RMS voltage of the voltage waveform of the AC line;
    generating indicia of the output voltage of the power supply;
    generating indicia of the current from the rectifier; and
    modulating the energy of the energy transformation circuit in accordance with the indicia of the RMS voltage, the indicia of the output voltage, and the indicia of the current, and the synthesized waveform according to a predetermined algorithm to draw input current sinusoidally in phase with input voltage.

28. The method of claim 26, wherein the step of controlling the energization of the energy transformation circuit comprises the steps of:
    generating a first error signal indicative of the deviation of the output voltage from a predetermined reference voltage;
    generating an RMS error signal indicative of the deviation of the RMS voltage of the voltage waveform of the AC line from a predetermined value;
    combining the synthesized waveform, the first error signal, and the RMS error signal to generate a multiplier output signal;
    generating a current sense signal indicative of the current from the rectifier;
    comparing the multiplier output signal to the current sense signal to generate a difference output signal;
    modulating the energy of the energy transformation circuit in accordance with the difference output signal.

29. The method of claim 28, wherein the RMS error signal comprises indicia of the inverse of the square of the difference in RMS voltage of the AC line from a predetermined reference value.

30. A method of producing a substantially constant output voltage from a predetermined number of phase pairs without producing substantial line harmonics, comprising the steps of:
    rectifying the voltage across each phase pair;
    applying the rectified voltages from each phase pair to a respective energy transformation circuit associated with the phase pair;
    applying the output of each energy transformation circuit to a common output voltage capacitor; and controlling the energization of the energy transformation circuit associated with each phase pair in accordance with a synthesized waveform phase-locked to the phase pair to draw input current sinusoidally in phase with the input voltage.

31. The method of claim 30, wherein the indicia of the RMS voltage comprises indicia of the inverse of the square of the RMS voltage of the associated phase pair.

32. The method of claim 30, wherein the step of controlling the energization of the energy transformation circuit comprises the steps of:
generating indicia of the RMS voltage of the voltage waveform of the associated phase pair;
generating indicia of the output voltage of the power supply;
generating indicia of the current from the rectifier; and
modulating the energy of the energy transformation circuit in accordance with the indicia of the RMS voltage, the indicia of the output voltage, and the indicia of the current, and the synthesized waveform according to a predetermined algorithm to draw input current sinusoidally in phase with input voltage.

33. The method of claim 30, wherein the step of controlling the energization of the energy transformation circuit comprises the steps of:
generating a first error signal indicative of the deviation of the output voltage from a predetermined reference voltage;
generating an RMS error signal indicative of the deviation of the RMS voltage of the voltage waveform of the associated phase pair from a predetermined value;
combining the synthesized waveform, the first error signal and the RMS error signal to generate a multiplier output signal;
generating a current sense signal indicative of the current from the rectifier;
comparing the multiplier output signal to the current sense signal to generate a difference output signal; and
modulating the energy of the energy transformation circuit in accordance with the difference output signal.

34. The power supply of claim 1, wherein the control circuit comprises means for controlling the duty cycle of the power switch in accordance with:
the deviation of the output voltage from a predetermined reference voltage;
the inverse of the square of the deviation of the RMS voltage of the AC line from a predetermined reference voltage;
the indicia of a desired waveform;
and the current from the rectifier.

35. A low line current harmonic apparatus, adapted to receive power from an AC line, the apparatus including:
a rectifier responsive to the AC line voltage;
a capacitor disposed in parallel across the output of the power supply;
an energy transformation circuit interposed between the rectifier and the capacitor;
a power switch, responsive to a control signal applied thereto, for selectively energizing the energy transformation circuit;
a control circuit, for executing the basic control algorithm for generating the control signal to the power switch;
the apparatus characterized in that:
the apparatus includes a means, phase-locked to the voltage waveform of the AC line, for synthesizing indicia of a desired input current waveform reference; and
the control signal to the power switch is derived, at least in part, from the indicia of the desired waveform.

36. A low line current harmonic apparatus, adapted to receive power from an AC line, including a predetermined number of phase pairs, wherein the apparatus comprises:
a capacitor disposed in parallel across the output of the power supply;
means for generating indicia of the phase of each phase pair of the AC line;
and, for each phase pair:
a rectifier responsive to the AC line voltage on the phase pair;
an energy transformation circuit connected between the rectifier for the phase pair and the capacitor;
a power switch, responsive to a control signal applied thereto, for selectively energizing the energy transformation circuit;
means, responsive to the indicia of the phase of the phase pair, for synthesizing indicia of a desired input current waveform reference; and
a control circuit, for executing the basic control algorithm, which is responsive to the indicia of the desired waveform for the phase pair, for generating the control signal to the power switch.

37. A method of producing a substantially constant output voltage from an AC line without producing substantial line harmonics, comprising the steps of:
rectifying the voltage across the AC line;
applying the rectified voltage to an energy transformation circuit;
applying the output of the energy transformation circuit to an output voltage capacitor; and
controlling the energization of the energy transformation circuit in accordance with the basic control algorithm, phase-locked to the voltage waveform of the AC line to draw input current sinusoidally in phase with input voltage.

38. A method of producing a substantially constant output voltage from a predetermined number of phase pairs without producing substantial line harmonics, comprising the steps of:
rectifying the voltage across each phase pair;
applying the rectified voltages from each phase pair to a respective energy transformation circuit associated with the phase pair;
applying the output of each energy transformation circuit to a common output voltage capacitor; and
controlling the energization of the energy transformation circuit associated with each phase pair in accordance with the basic control algorithm, phase-locked to the phase pair to draw input current sinusoidally in phase with the input voltage.

39. The apparatus of claims 35, 36, 37, and 38, wherein the control circuit executing the control algorithm, which produces the control signal is a single integrated circuit chip.

40. The method of claim 39, wherein additionally the phase locked current waveform reference synthesizing is incorporated into the single integrated circuit chip.

41. The method of claim 40, wherein additionally all input control signals and their conditioning functions are incorporated into the single integrated circuit chip.

* * * * *